United States Patent [19]

Johnson et al.

[11] Patent Number: 5,798,921
[45] Date of Patent: Aug. 25, 1998

[54] AUDIO STORAGE/REPRODUCTION SYSTEM WITH AUTOMATED INVENTORY CONTROL

[76] Inventors: Todd M. Johnson, 3331 Mail Ct., Michigan City; Robert Ramion, 6447 W. 450 N., La Porte, both of Ind. 46360; Wilbur Johnson, 1634 Mulvane, Topeka, Kans. 66604

[21] Appl. No.: 436,003

[22] Filed: May 5, 1995

[51] Int. Cl.$^6$ .............................. G06F 12/00; H03M 3/00
[52] U.S. Cl. .................... 364/400.01; 364/249.2; 364/954.2; 395/427; 360/32; 365/45
[58] Field of Search .................. 370/94.2, 110.1, 370/85.1; 364/514 A, 927.92, 940, 400.01, 236.6, 249.2, 249, 954, 954.3, 954.2; 395/2.1, 154, 430, 427, 431, 428, 432, 280; 369/1, 13, 14, 15, 30, 47, 75.1, 178, 272, 275.2; 365/45, 52, 63, 78, 189.01, 189.02, 230.01, 230.02; 361/600, 796; 360/92; 341/110

[56] References Cited

U.S. PATENT DOCUMENTS

| | | | |
|---|---|---|---|
| 4,254,473 | 3/1981 | Galdun et al. | 364/940 |
| 4,268,826 | 5/1981 | Scott et al. | 341/20 |
| 4,772,873 | 9/1988 | Duncan . | |
| 4,862,320 | 8/1989 | Schmidt et al. | 361/796 |
| 4,963,866 | 10/1990 | Duncan | 341/110 |
| 5,034,935 | 7/1991 | Ishibashi et al. . | |
| 5,038,317 | 8/1991 | Callan et al. | 364/927.92 |
| 5,059,772 | 10/1991 | Younglove | 360/92 |
| 5,103,986 | 4/1992 | Marlowe | 211/41 |
| 5,145,447 | 9/1992 | Goldfarb . | |
| 5,214,768 | 5/1993 | Martin et al. . | |
| 5,228,015 | 7/1993 | Arbiter et al. . | |
| 5,359,698 | 10/1994 | Goldberg et al. | 395/2.1 |
| 5,475,835 | 12/1995 | Hickey | 395/600 |
| 5,511,000 | 4/1996 | Kaloi et al. | 364/514 A |
| 5,535,356 | 7/1996 | Kim et al. | 395/430 |
| 5,553,220 | 9/1996 | Keene | 395/154 |
| 5,553,864 | 9/1996 | Sitrick | 463/31 |

OTHER PUBLICATIONS

This Chip Can Make Almost Anything Talk, Naomi Freundlich, Science & Technology, *Business Week*, Mar. 11, 1991, p. 93.
Voice—storage chip supplies nonvolatile analog memory, Jon Titur, *EDN*, Feb. 18, 1991, p. 127.
ISDNXX Analog Storage KS, Innovation, *Electronic Business*, Jan. 27, 1992.
Here Comes Analog Memory, Bill Arnold, *EDN*, vol. 36, No. 3A, pp. 1, 38.
Sanyo takes stake in ISD's audio chip, James S. Goldman, *The Business Journal*, Apr. 27, 1992, pp. 1, 15.
Puttin On the Ritz, Teri Sprackland, *Electronic Business*, Jan. 27, 1992, pp. 20–23.
New formats debuted in 1992, Prerecorded Music, Industry Surveys, *Leisure Time*, Mar. 11, 1993, pp. 32–34.

*Primary Examiner*—Wellington Chin
*Assistant Examiner*—Huy D. Vu
*Attorney, Agent, or Firm*—Patula & Associates

[57] ABSTRACT

An audio system is disclosed wherein music cartridges are utilized in a series of cartridge racks for non-mechanical playback and recordation of an entire music collection. The audio signals are stored on music cartridges which are insertable into one of a plurality of cartridge racks. The cartridge racks are operatively connected with the music player of the audio system. The audio system is completely solid state, i.e. it has no moving parts and has the advantages of allowing quick and reliable playback and storage of any music cartridge of the user's entire selection, as desired by the user. The system is self-programmable and expandable, whereby additional cartridge racks can be connected for additional storage of music cartridges allowing any music cartridge from the entire collection to be accessed at anytime.

8 Claims, 22 Drawing Sheets

AUDIO STORAGE/REPRODUCTION SYSTEM WITH AUTOMATED INVENTORY CONTROL

This invention relates to storage/reproduction systems and more particularly to audio storage/reproduction systems, and specifically to the solid state storage and reproduction of an entire collection of music.

BACKGROUND OF THE INVENTION

People of all ages enjoy listening to music. Today, most people either own or have access to a stereo system. Typical stereo systems include either a tape deck for playing audio cassette tapes or a CD player for playing compact discs or both. It is not uncommon to find a large library of music collections. Some people even have hundreds and thousands of audio cassette tapes or compact discs. However, existing stereos today are only capable of or limited to playing a very limited number of these cassette tapes or compact discs at the same time. For example, a tape deck might at the most have two tape players. Therefore, a person utilizing such a tape deck can only play two cassette tapes at the same time, without having to change the tapes. When different tapes are desired to be played the user must interchange the tape to the desired tape from the collection. Similarly with compact discs, even the most expensive compact disc home stereo components can only hold up to 100 CDs at the same time, with common CD players limited to a 1 to 12 disk capacity. A person with a collection of 400 CDs must constantly interchange several CDs at a time in order to listen to different types of music on the different CDs. Such systems require mechanical parts in order to physically move or rotate the cassette tape or the CDs. Over time the constant movement of these stereo components can cause the stereo system to wear down and break. Further, dust and other foreign material can accumulate over time and damage either the player, the tapes or CDs, or both.

There are many audio systems or devices which can be used as part of a stereo system. For example, U.S. Pat. No. 4,772,873 issued to Duncan discloses a digital electronic recorder/player. Duncan's invention is a digital record/playback apparatus including an input digital filter, an A/D converter, a solid state memory, a D/A converter, and an output digital filter. Duncan differs from the present invention in that Duncan is a means for storing data on a chip wherein the present invention is a means for selectively inventorying and recalling information from any one of a plurality of storage mediums located in one of a series of storage rack units. The present invention is for use as a component of a home stereo system that will organize, catalog and display a user's entire music collection stored in a series of storage racks. Duncan does not provide for the storage of music on cartridges which are insertable into a series of cartridge racks and selectively inventoried and played. The present invention utilizes a visual display and has the ability to record music and to selectively playback music from the entire collection by artist, category, album, song, year, etc. The present invention is self-programmable/deprogrammable and has the ability to interface with a printer, television or a personal computer.

U.S. Pat. Nos. 5,228,015 and 5,034,935, issued to Arbiter, et al. and Ishibashi, et al. respectively, disclose multi-compact disc players. The inventions of Arbiter, et al. and Ishibashi, et al. differ from the present invention because the present invention is completely solid state, i.e. has no moving parts. The player of the present invention is self-programmable/deprogrammable and includes a visual display. Neither Arbiter, et al. nor Ishibashi, et al. has the ability to record music or to select music from the entire collection by artist and/or category. The inventions of Arbiter, et al. and Ishibashi, et al. do not provide for expendability and there is a delay in the time between the playing of albums. The present invention is expandable, self-programmable/deprogrammable, and has the ability to interface with a printer, television, or a personal computer.

U.S. Pat. No. 5,145,447, issued to Goldfarb discloses a multiple choice verbal sound toy which utilizes a microprocessor to produce one song or poem that has at least one space or slot for introducing a supplementary verbal sound segment to complete the song or poem. The present invention differs from Goldfarb in that Goldfarb does not selectively play back music from a user's music collection stored in a plurality of storage units. Goldfarb does not have the ability to record music or to access an entire music collection and selectively playback music by artist or category. Further, Goldfarb is not expandable nor can Goldfarb interface with additional components such as a printer, a television or a personal computer. The present invention is self-programmable/deprogrammable and allows for expansion.

U.S. Pat. No. 5,214,768, issued to Martin, et al. discloses a mass data storage library which includes a plurality of mass data storage modules that form a mass information storage library, a data directory archive for maintaining a directory of the information contained on each data storage module, and data record/playback modules for receiving any selected data storage module in the mass storage library. Martin, et al. differs from the present invention in that the present invention selectively plays back music from a user's entire music collection stored in a plurality of storage racks and is completely solid state, thereby utilizing no moving parts. Further, the present invention is self-programmable/deprogrammable and provides a visual display, wherein Martin, et al. does not. The present invention has the ability to record music while the invention of Martin, et al. does not.

Accordingly, there is a need for an audio system that can readily play a person's entire collection of music without the need for interchanging the musical storage medium. Further, there is a need for an audio player which has no mechanical parts, thereby, providing an extremely reliable and durable apparatus. Further, it is necessary for such a system to have all present abilities of a typical stereo system including all playback options as well as recordability; and in addition thereto, selective playback of music by category, artist, album, song, year, etc., and complete inventorying of an entire music collection, even upon expansion of the music collection.

The present invention solves these shortcomings of the typical stereo system by providing a self-programming/deprogramming, expandable, completely solid state musical storage and playback system for an entire collection of music without the need to ever interchange a musical storage medium.

BRIEF SUMMARY OF THE INVENTION

The present invention comprises an audio player, a cartridge holder or rack, at least one musical storage medium or cartridge, and associated software used to run the audio system of the present invention. The audio player of the present invention is a computer with a display, keypad and communications port. The musical cartridges of the present invention contain music stored on memory storage devices such as a digital storage medium or an analog chip. The player will download a database of album information from an EEPROM contained in each musical cartridge located in the cartridge holder or cartridge rack into local RAM memory when the system is first activated. After the system is activated, the user has the ability to list albums alphabetically, play the entire collection of music, choose to listen to a particular musical cartridge, play all the musical cartridges, choose a single cartridge according to artist, choose cartridges according to categories of music, selectively program a multiple number of selections to listen to and even record music to a chosen cartridge.

The audio system of the present invention comprises no moving parts and is very durable and reliable. This system of the present invention is expandable and allows the user the capability of immediately selecting and playing music from the person's entire collection without the need for interchanging a musical storage medium. Additionally, the player will identify when a cartridge has been removed or added to the system. When added, it will automatically program itself as to what has been added, i.e., album title, song titles, name of artist, year album released, type of music, as well as where it is, i.e., on which slot of which cartridge rack and the points as to where each song begins on that particular cartridge. If a cartridge is removed, the system will automatically remove all the above-mentioned information from the player, keeping the inventory current and up to date by way of an initiation process. (See FIG. 13)

Accordingly, it is the principle object of the present invention to provide an expandable automatic inventory processing storage/reproduction system for audio systems.

It too is an object of the invention to provide an audio system allowing selective choosing of various playback modes of an entire music collection.

It is the further object of the invention to provide an audio system having no moving parts.

It is also the object to provide an audio system which is capable of playing and recording music from the entire musical collection of the user without the need to interchange musical storage medium.

It is an additional object of the invention to provide an expandable audio system, unlimited in the amount of music available.

It is another object of the invention to provide an audio system having an electronic inventory system that allows expansion of the system without the need for the user to enter or remove information from the system.

It is still another object of the invention to provide an audio system component having a central processing unit for quick and efficient inventory and organization of a user's entire music collection.

Numerous other advantages and features of the invention will become readily apparent from the detailed description of the preferred embodiment of the invention, from the claims, and from the accompanying drawings in which like numerals are employed to designate like parts throughout the same.

BRIEF DESCRIPTION OF THE DRAWINGS

A fuller understanding of the foregoing may be had by reference to e accompanying drawings wherein.

DETAILED DESCRIPTION OF THE PREFERRED EMBODIMENT OF THE PRESENT INVENTION

Figure 1:
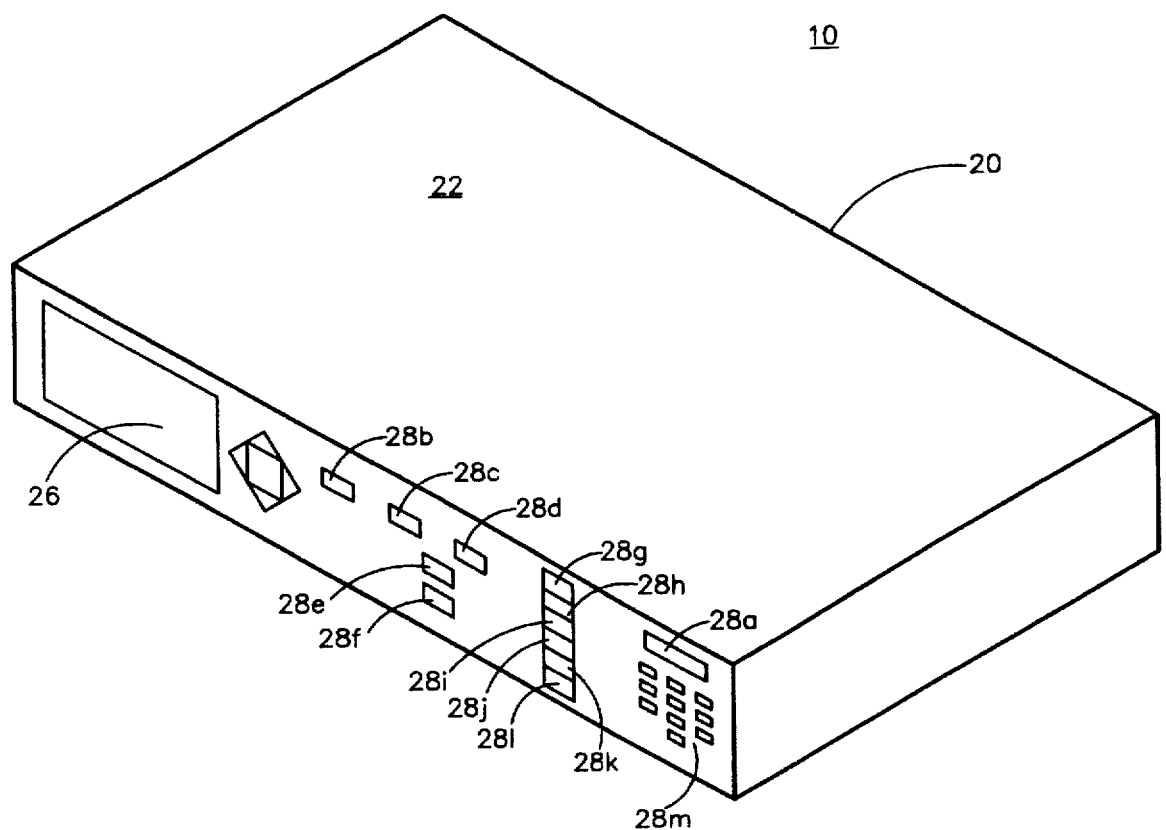
FIG. 1 is a perspective view of the audio player of the preferred embodiment of the present invention.

While the invention is susceptible of embodiment in many different forms, there is shown in the drawings and will be described herein in detail, a preferred embodiment of the invention. It should be understood, however, that the present disclosure is to be considered an exemplification of the principles of the invention and is not intended to limit the spirit and scope of the invention and/or claims of the embodiment illustrated.

FIGS. 1 through 12 illustrate the hardware of the present invention 10 comprising audio player 20 and cartridge holder/storage rack 60, for use with amplifier 50 and music cartridges 90.

FIGS. 13 through 21 illustrate the software of the present invention allowing a person to list the music collection alphabetically, play the entire music collection, play music from a particular year, choose to listen to a particular album or song from the collection, let the computer choose a selection through random play, choose an album according to artist, choose an album according to musical category, program a multiple number of selections to listen to, record music to a chosen cartridge, etc.

FIG. 1 illustrates audio player 20 of the present invention 10. Audio player 20 includes a housing 22. On the front of the housing 22 is a visual display 26 and a user interface 28. Interface 28 includes a power button 28a, an Album button 28b, an Artist button 28c, a Category button 28d, a Program button 28e, a Random button 28f, a Rewind button 28g, a Fast Forward button 28h, a Play button 28i, a Stop button 28j, a Pause button 28k, a Record button 28l, numerical digits 0–9, collectively referenced as 28m, and a directional pad 28n, consisting of an Up directional 28o, a Down directional 28p, a Left directional 28p, and a Right directional 28r. The buttons of interface 28 are used by the user to selectively play a desired sequence of music from the user's musical collection.

Figure 2:
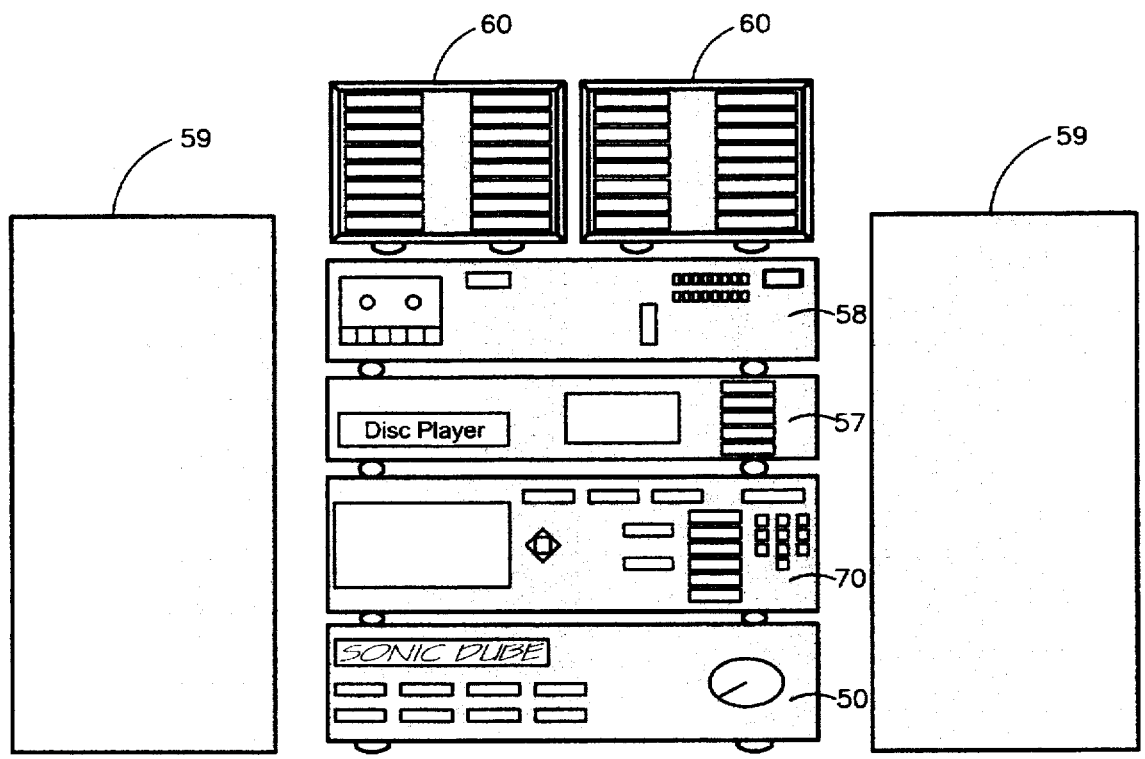
FIG. 2 is a front view of preferred embodiment of the present invention in use in a home stereo system.

FIG. 2 illustrates the player 20 in use with a home stereo system. As can be seen in FIG. 2, player 20 is utilized as a component of a stereo system having an amplifier 50, a CD player 57, a tape deck 58, speakers 59, and music cartridge racks 60. FIG. 2 is shown having two cartridge racks 60 in use with the stereo system. However, the present invention is expandable, wherein any number of cartridge racks 60 can be utilized at the same time, and player 20 can access and play any song from any cartridge in any rack.

Figure 3:
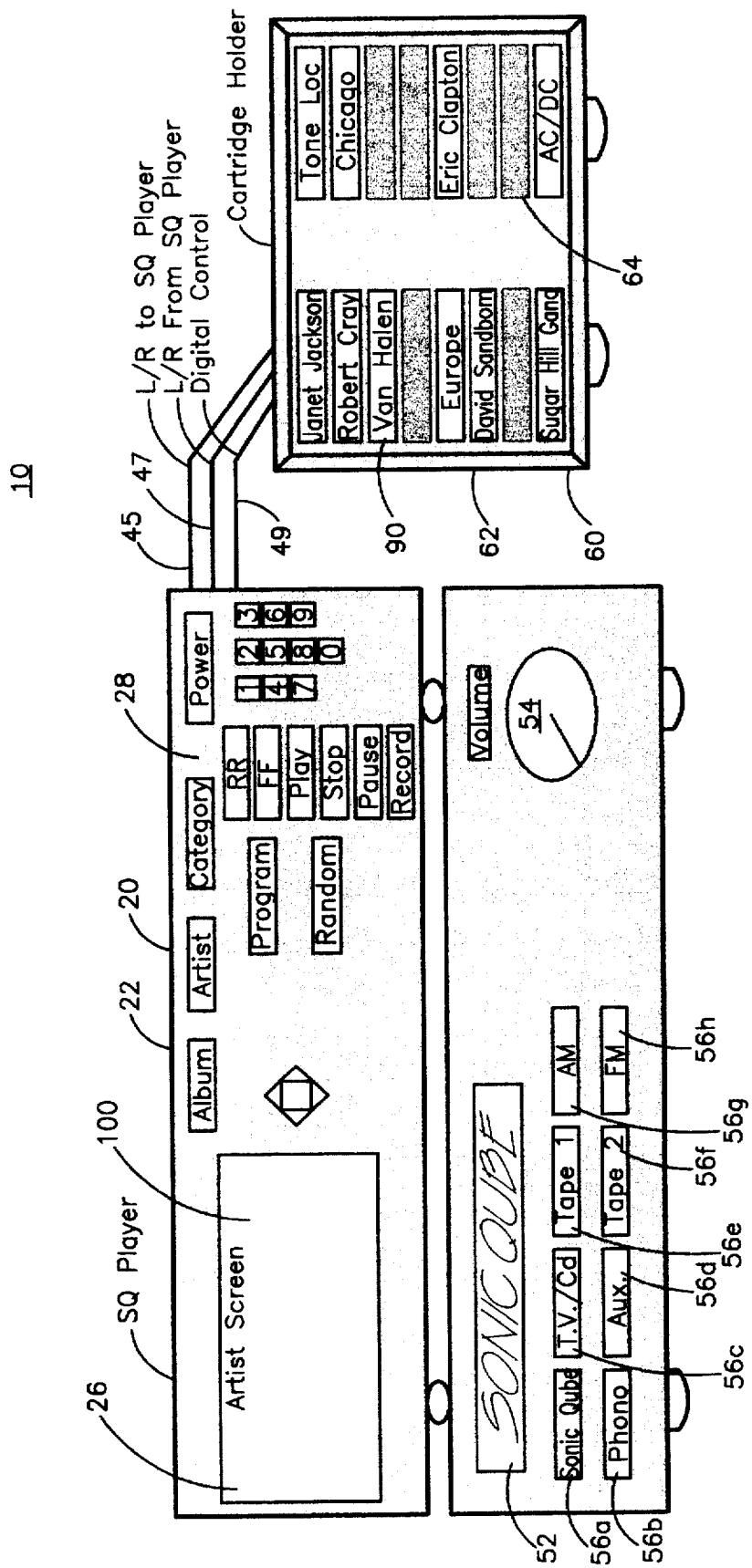
FIG. 3 is a front view of the preferred embodiment of the present invention.

FIG. 3 shows a front view of player 20 in use with amplifier 50 and connected to a cartridge holder/storage unit 60. As can be seen, player 20 includes housing 22 having visual display 26 (displaying a portion of digital database 100, see FIG. 11) and interface 28. Player 20 is shown resting on top of an amplifier 50 which includes a visual display 52, a volume control 54 and selection buttons 56 for selectively choosing the component of the stereo system desired to be utilized. Buttons 56 include the Player 20 button entitled "Sonic Cube" 56a, a Phono button 56b, a TV/CD button 56c, an auxiliary button 56d, a Tape One button 56e, a Tape Two button 56f, an AM button 56g, and an FM button 56h. The name of the component corresponding to the selected button 56a–56h appears on the display 52.

Player 20 is further connected to cartridge holder/storage rack 60 via an EIA-485 interface and stereo cables 45, 47 and 49. Cartridge holder 60 is shown comprising a housing 62 having a plurality of cartridge slot 64 therein. Music cartridges 90 are selectively inserted into cartridge slots 64.

Figure 4:
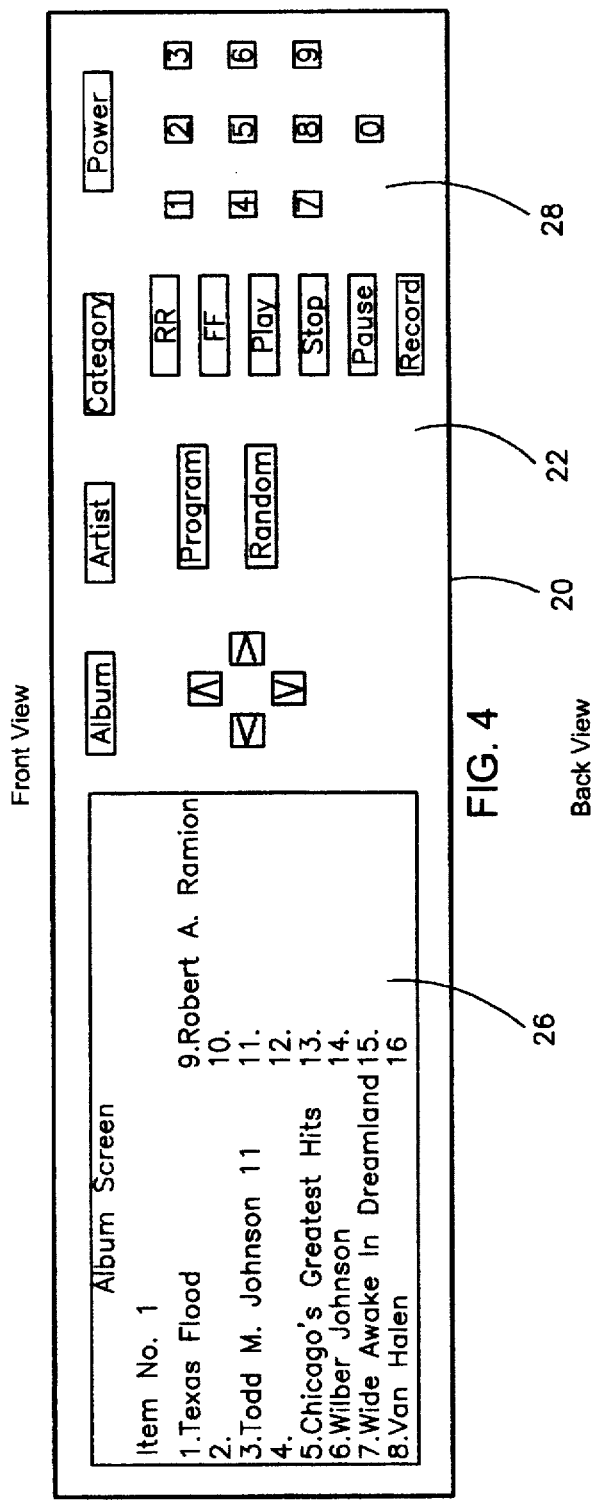
FIG. 4 is a front view of the audio player of the present invention.

FIG. 4 shows a front view of player 20 including housing 22, visual display 26, and interface 28.

Figure 5:
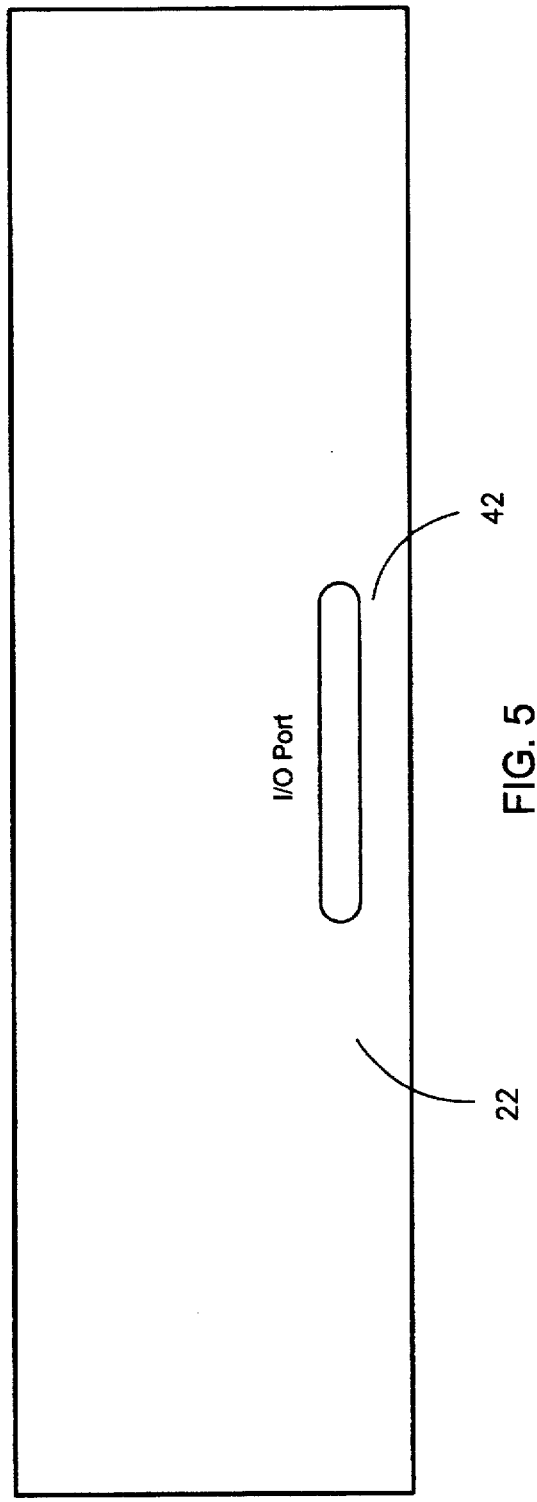
FIG. 5 is a back view of the audio player of the present invention.

FIG. 5 shows a back view of player 20 including housing 22 and communications port or input/output port 42.

Figure 6:
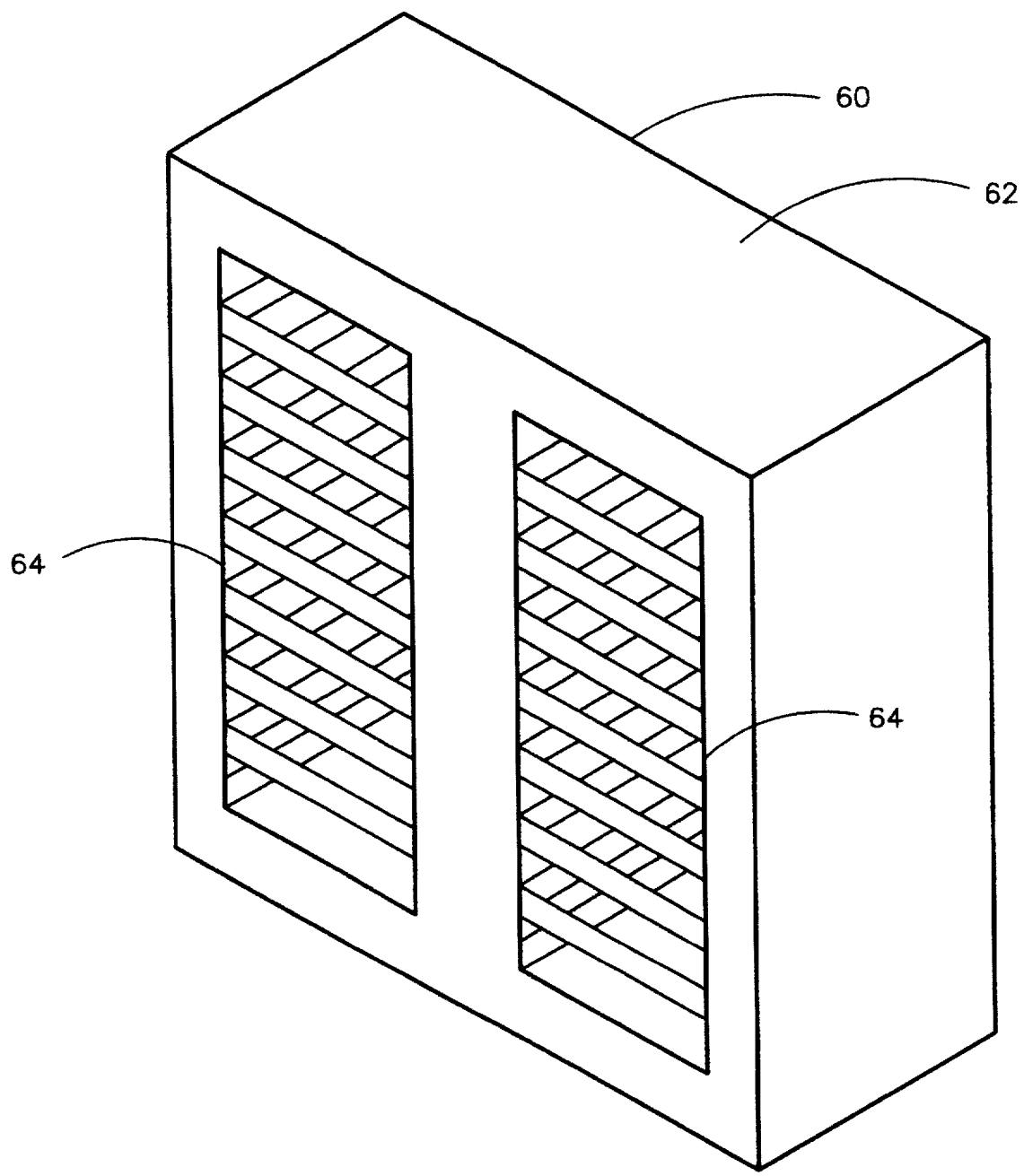
FIG. 6 is a perspective view of the cartridge holder/rack of the present invention.
Figure 9:
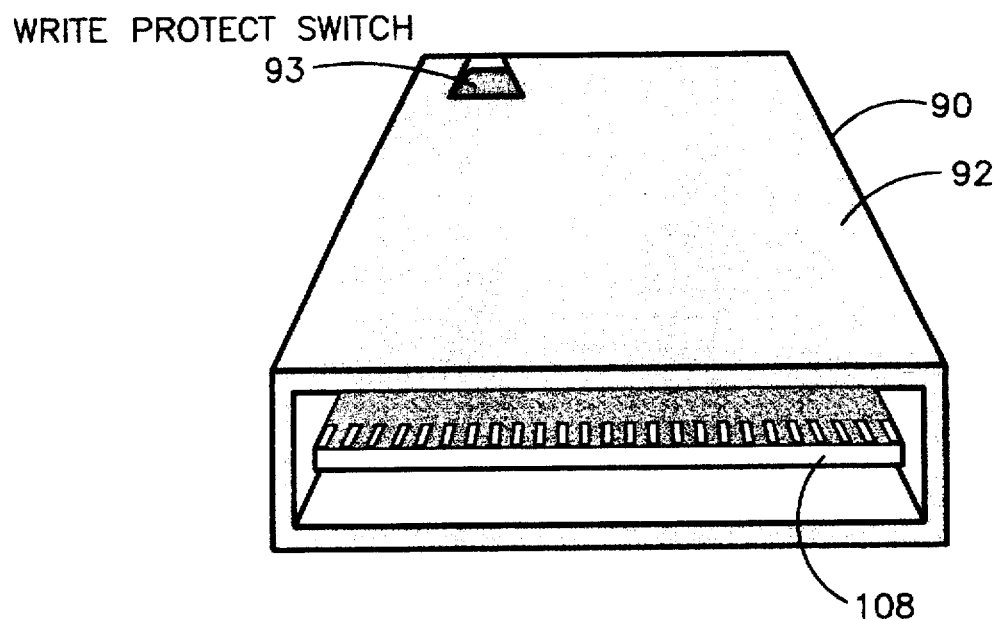
FIG. 9 is a perspective view of a music cartridge of the present invention.

FIG. 6 illustrates a musical cartridge holder/cartridge storage rack 60 including housing 62 and a plurality of cartridge slots 64, each having a cartridge connector receiver 65 mounted in housing 62 at the back end of each slot 64, for receiving connector 108 of cartridge 90 (See FIG. 9). It is foreseeable that cartridge slots 64 could have pivotable covers or flaps which prevent dust or other foreign material from entering the slots when not in use. The covers or flaps would pivot out of the way when a cartridge is inserted into a slot.

Figure 7:
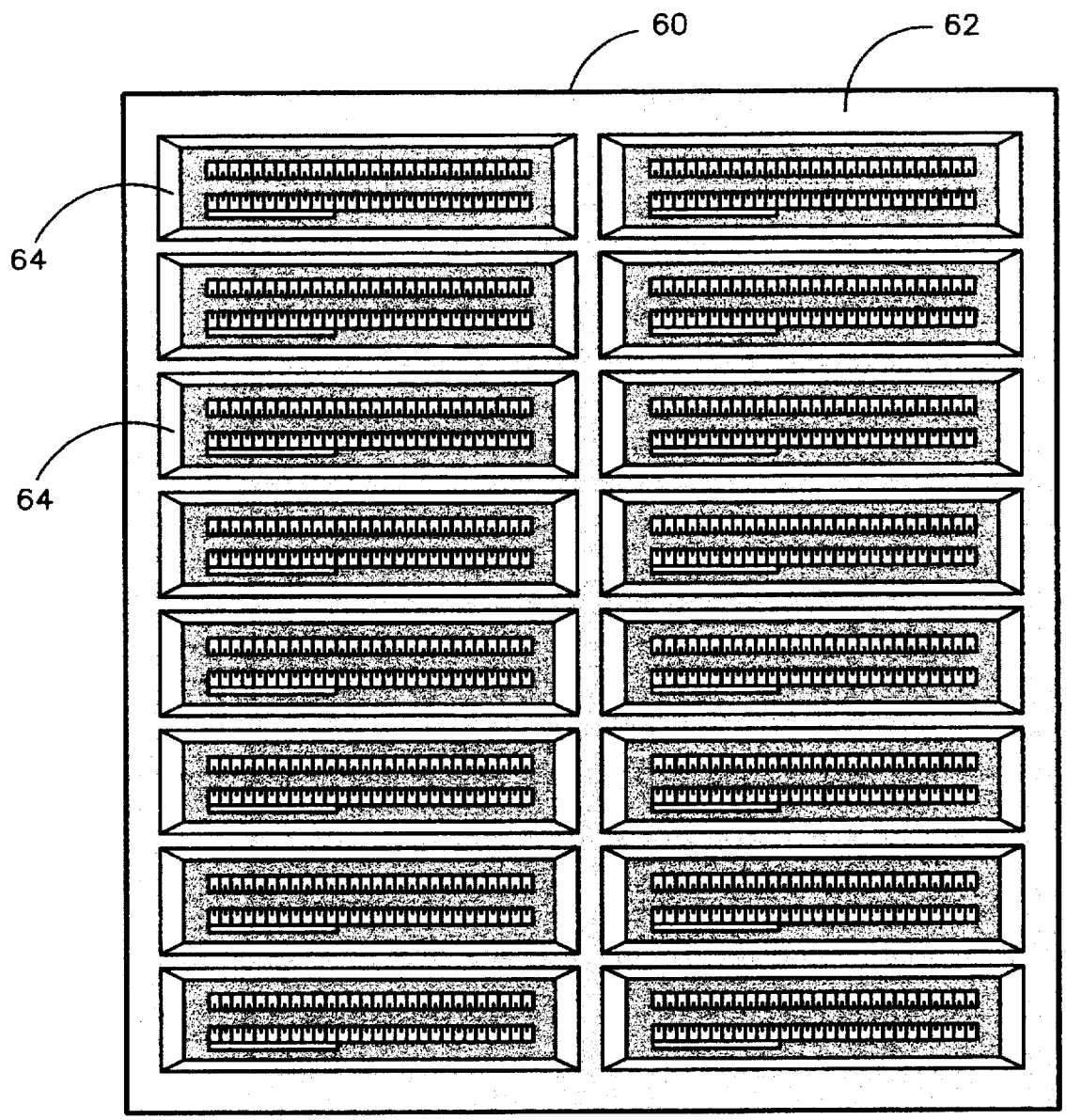
FIG. 7 is a front view of the cartridge holder of FIG. 6.

FIG. 7 shows a front view of the musical cartridge holder/storage rack 60 including housing 62 and plurality of cartridge slot 64. As can be seen, each slot 64 includes a cartridge connector receiver 65 at the back end thereof for receiving a cartridge connector tongue 108 of each cartridge 90 (see FIG. 9).

Figure 8A:
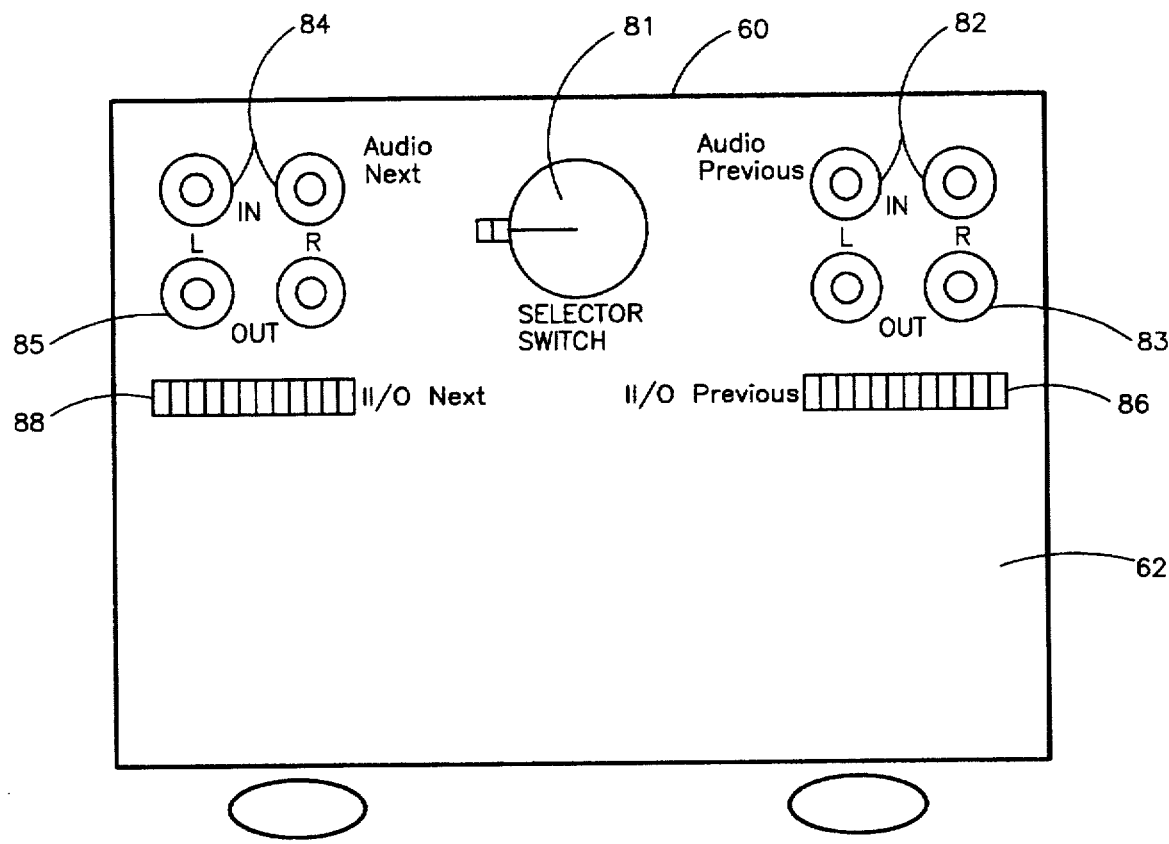
FIG. 8a is a back view of the cartridge holder of FIG. 6.

FIG. 8a illustrates a back view of the musical cartridge holder/storage rack 60. Rack 60 includes housing 62 having audio-in previous jacks 82, audio-out previous jacks 83, audio-in next jacks 84, audio-out next jacks 85, input/output previous jack 86 and input/output next jack 88. Rack 60 also includes a selector switch 81 which is set to indicate the position of the rack in a series of racks as indicated and referenced in the selector switch display window.

Figure 8B:
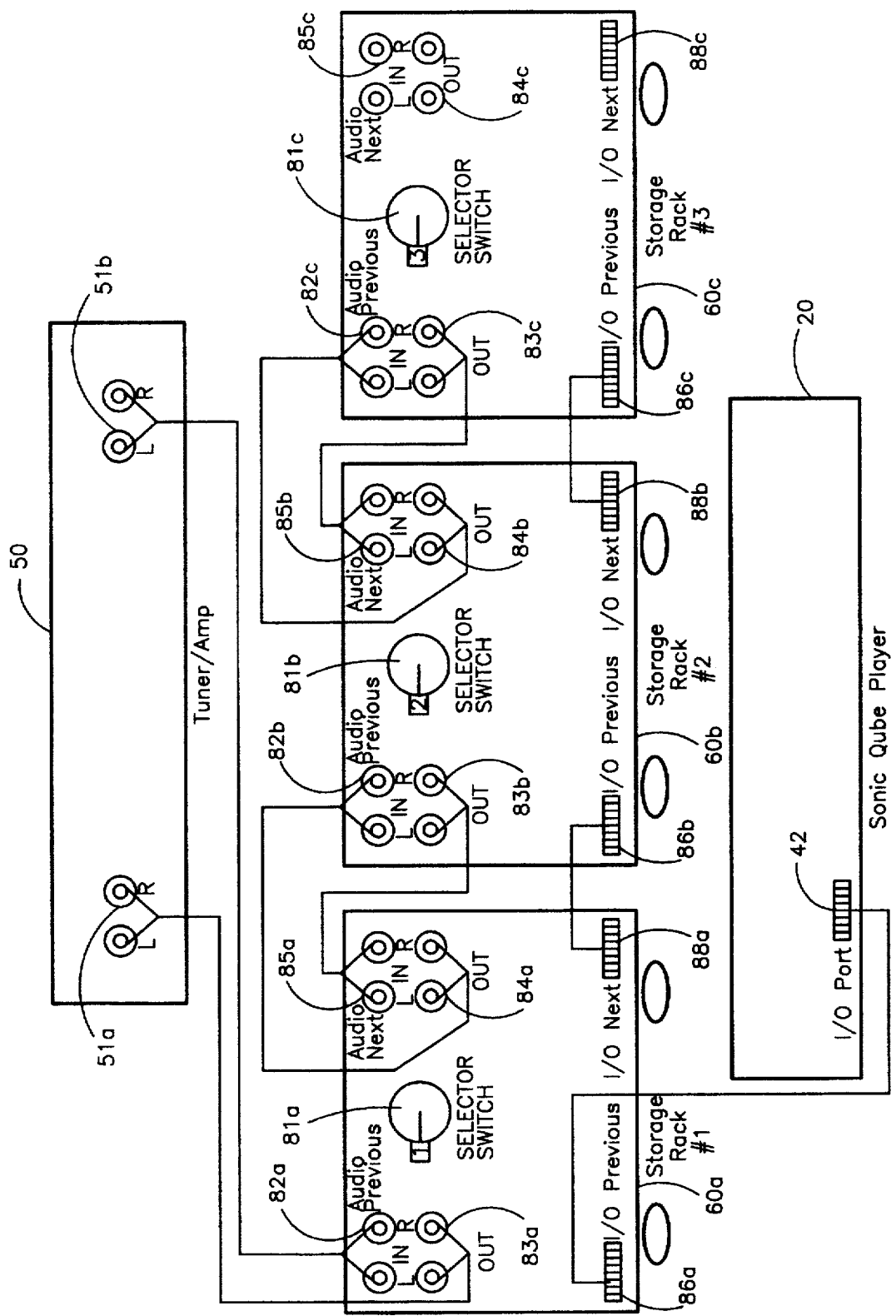
FIG. 8b is a back view of the present invention illustrating three cartridge holders/racks connected together.

FIG. 8b shows a back view of the present invention illustrating player 20 connected to three cartridge/storage racks 60a, 60b, 60c connected in series. Cartridge racks 60a–c are in turn connected to tuner/amplifier 50. The EIA 485 Interface of player 20 is connected to cartridge rack 60a via an electrical communication from the player's input/output port 42 to the input/output previous jack 86a of rack 60a. The selector switch 81a of rack 60a is set to a first position to indicate that rack 60a is the first rack in the series of racks.

Rack 60a is connected to Rack 60b via a cable from the input/output next jack 88a of rack 60a to the input/output previous jack 86b of rack 60b. Similarly, rack 60b is connected to rack 60c via a cable from the input/output next jack 88b to the input/output previous jack 86c. Input/output jack 88c of rack 60c remains free to be connected to additional racks. Selector switch 81b and 81c of racks 60b and 60c, respectively, are set to a second and third position, respectively, to indicate their order in the series.

Rack 60a is further connected to tuner/amplifier 50 via an electrical communication (stereo cables) from audio-out previous jack 83a of rack 60a to audio-in jack 51a of amplifier 50, and from audio-in previous jack 82a to audio-out jack 51b. Further, the audio jacks of the racks 60a–c are connected in series with audio-in next jack 84a being connected to audio-out previous jack 83b, audio-out next jack 85a being connected to audio-in previous jack 82b, audio-in next jack 84b being connected to audio-out previous jack 83c, and audio-out next jack 85b being connected to audio-in previous jack 82c. Audio-in/out next jack 84c, 85c remain free to be connected to additional racks.

FIG. 9 illustrates a music cartridge 90 which includes a housing 92, a write protection switch 93, and a connector tongue 108. The digital information stored on this cartridge includes, for example, the album title, the song titles, the name of the artist, the year the album was released, the addresses for the beginning of each song and the identifier for each song. This digital information is initially downloaded and displayed on the visual display 26 of player 20. The audio signals or music is also stored on each cartridge and downloaded only when requested to be played.

Figure 10:
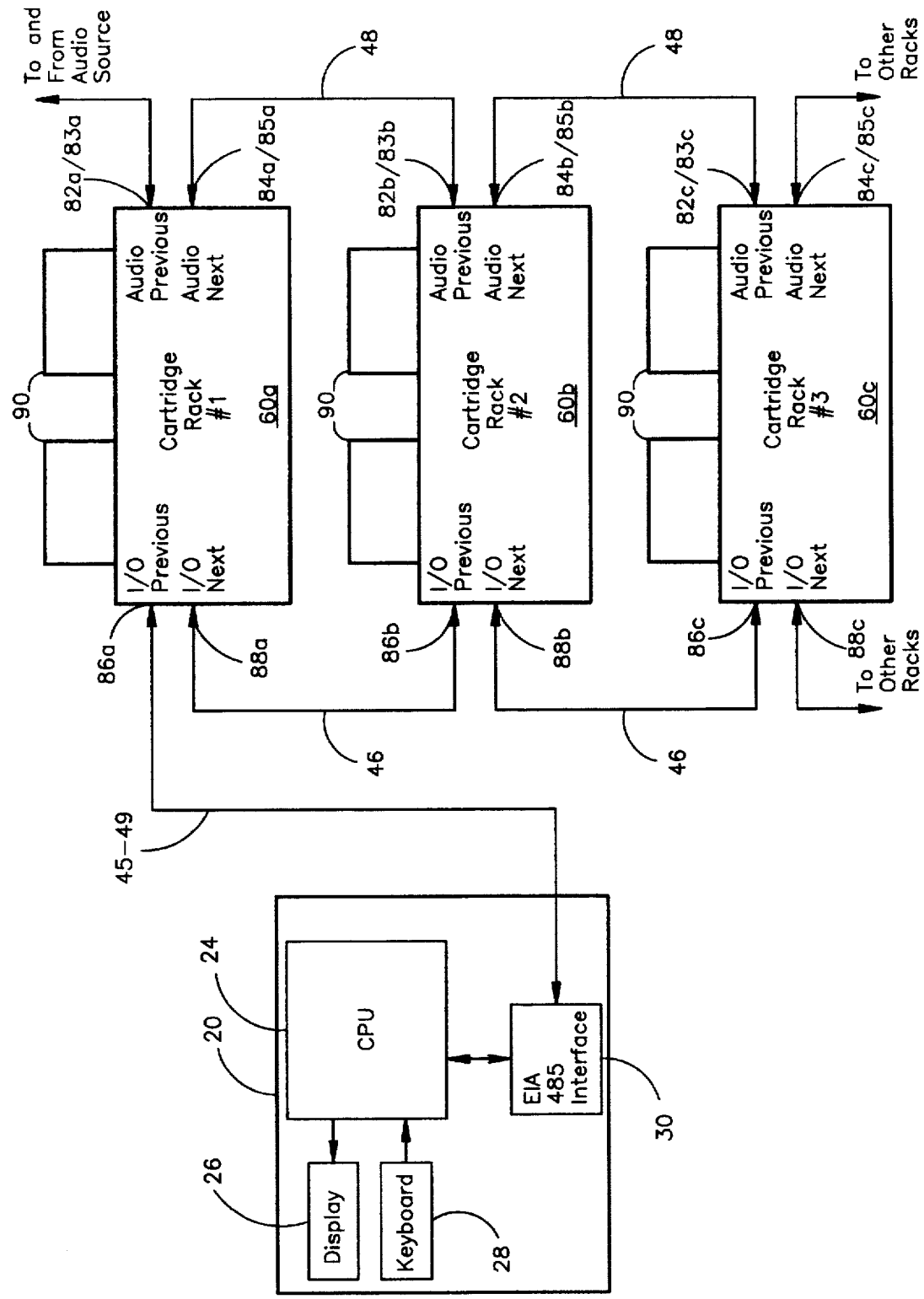
FIG. 10 is an overall schematic view of the entire audio system of the present invention.

FIG. 10 illustrates a schematic system overview of the present invention showing player 20 including display 26, interface 28, a CPU or computer 24 and an EIA-485 interface port 30. The player is connected to a first cartridge rack 60a via stereo cables 45, 47 and 49 and utilizing the EIA-485 interface communications. Additional cartridge racks 60b and 60c are connected to each other via stereo cables 46 and 48. As can be seen, a plurality of cartridge racks can be operatively connected in series, thereby providing for unlimited access to the entire music collection. Cartridge rack 60a–c are shown having audio previous jacks 82a–c/83a–c, audio next jacks 84a–c/85a–c, input/output previous jacks 86a–c, and input/output next jacks 88a–c, respectively.

As described in FIG. 8b, the audio previous jack 82a/83a of the first cartridge rack 60a is directly connected to the amplifier 50 and other devices in the stereo system. The audio next jack 84a–85a is connected to the audio previous jacks 82b–83b of the next cartridge rack 60b in the system. Each cartridge will be "daisy-chained" together in series in this manner. The audio connection contains signals required for playback and recording of music.

Figure 11A:
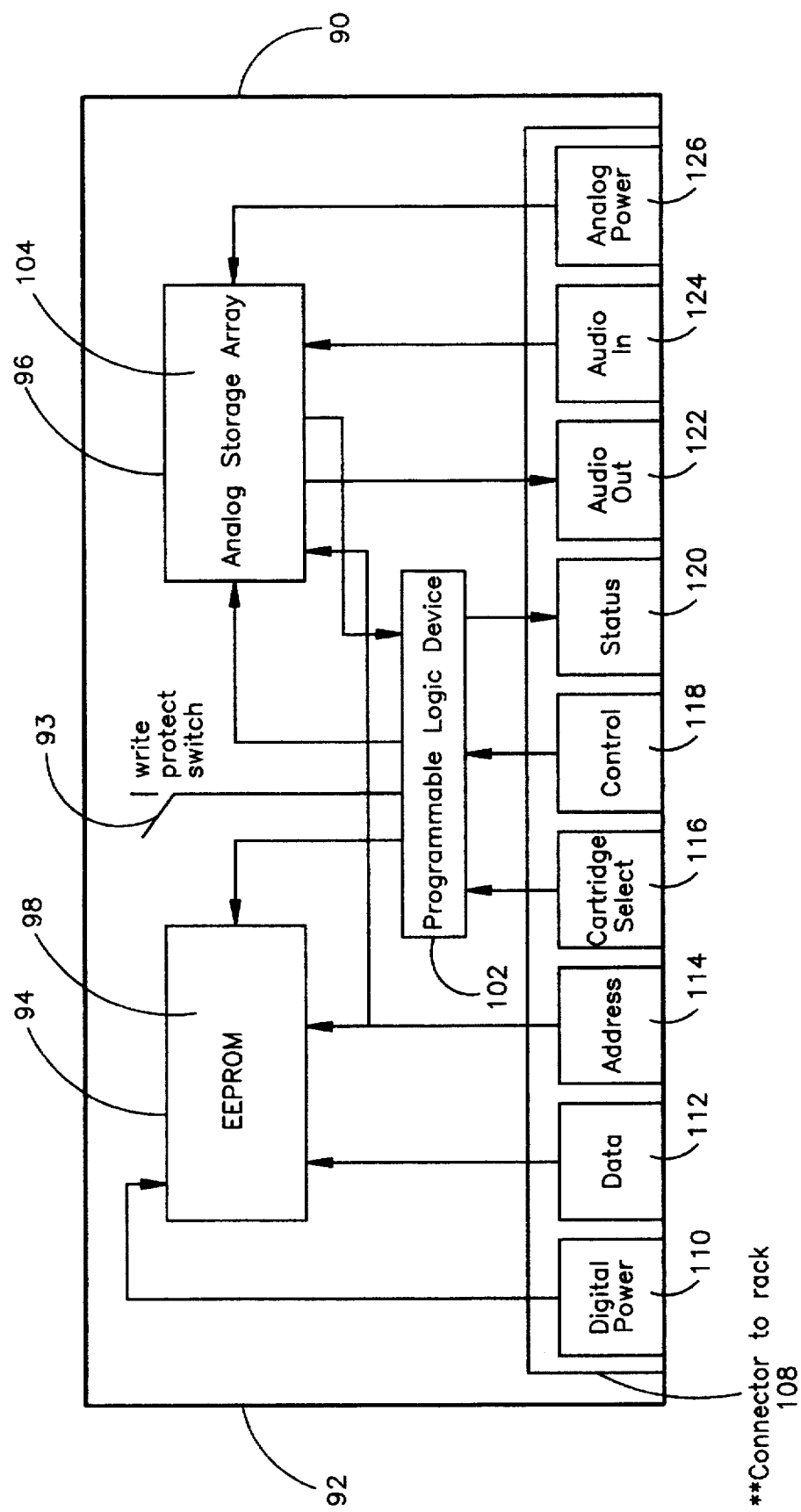
FIG. 11a is a block diagram of a music cartridge of the present invention.

FIG. 11a shows a schematic illustration of a music cartridge 90. Each music cartridge 90 contains two circuits, a digital circuit 94 and an audio memory storage circuit 96 suitably mounted inside housing 92. The digital circuit 94 is comprised of an EEPROM 98. The audio memory storage circuit 96 can be comprised of any suitable audio storage means 104 such as a digital storage medium (see FIG. 11b) or an analog storage medium. For example, circuit 96 can be comprised of a D-RAM chip for storing digital signals or an analog storage array 104 consisting of a plurality of cascaded analog storage chips. Music cartridge 90 further includes a logic circuit/programmable logic device 102, write protect switch 93 operatively connected to programmable logic device 102, as well as connector tongue 108 which operatively connects inside one of the cartridge connector receiver 65 of cartridge rack 60. Write protection switch 93 works by providing a recording status signal to the programmable logic device 102. The programmable logic device 102 passes this signal to the player via status contact 120 enabling it to record or not. Connector 108 includes digital power contact 110, data contact 112, address contact 114, cartridge select contact 116, control contact 118, status contact 120, audio-out contact 122, audio-in contact 124, and audio circuit power contact 126. Digital power contact 110 is operatively connected to the EEPROM 98 which contains digital database 100 (See FIG. 3) for display on the visual screen 26 of player 20. Similarly, data contact 112 operatively connects to EEPROM 98. Address contact 114 operatively connects to both EEPROM 98 and the audio storage medium 104. The cartridge select contact 116 operatively connects to the programmable logic device 102, as does control contact 118. The status contact 120 receives a signal from the programmable logic device 102. The audio-out contact 122 receives a signal from the audio storage. Audio-in contact 124 is operatively connected to audio storage medium 104 as is the audio circuit power contact 126 to provide for recording.

As stated above, each cartridge 90 comprises a digital circuit 94 and an audio memory storage circuit 96. The digital circuit 94 contains an EEPROM 98 which stores a database 100 of digital information about the songs on this cartridge 90, such as the information that is normally printed on the jacket of a music album. A logic circuit 102 on the cartridge 90, contained in a programmable logic device (PLD), activates the control signals from the microcontroller 72 (See FIG. 12) when the cartridge select line is activated for that cartridge slot 64. By way of example only, the audio memory storage circuit 96 can comprise an analog storage array made up of cascaded analog storage chips such as the ISD2560 manufactured by Information Storage Devices, San Jose, Calif., or an array of DRAM memory modules such as the MCM81600 manufactured by Motorola, Inc., Schaumburg, Ill. The exact number of chips required is dependent upon the length of storage to be provided by the cartridge 90.

Figure 11B:
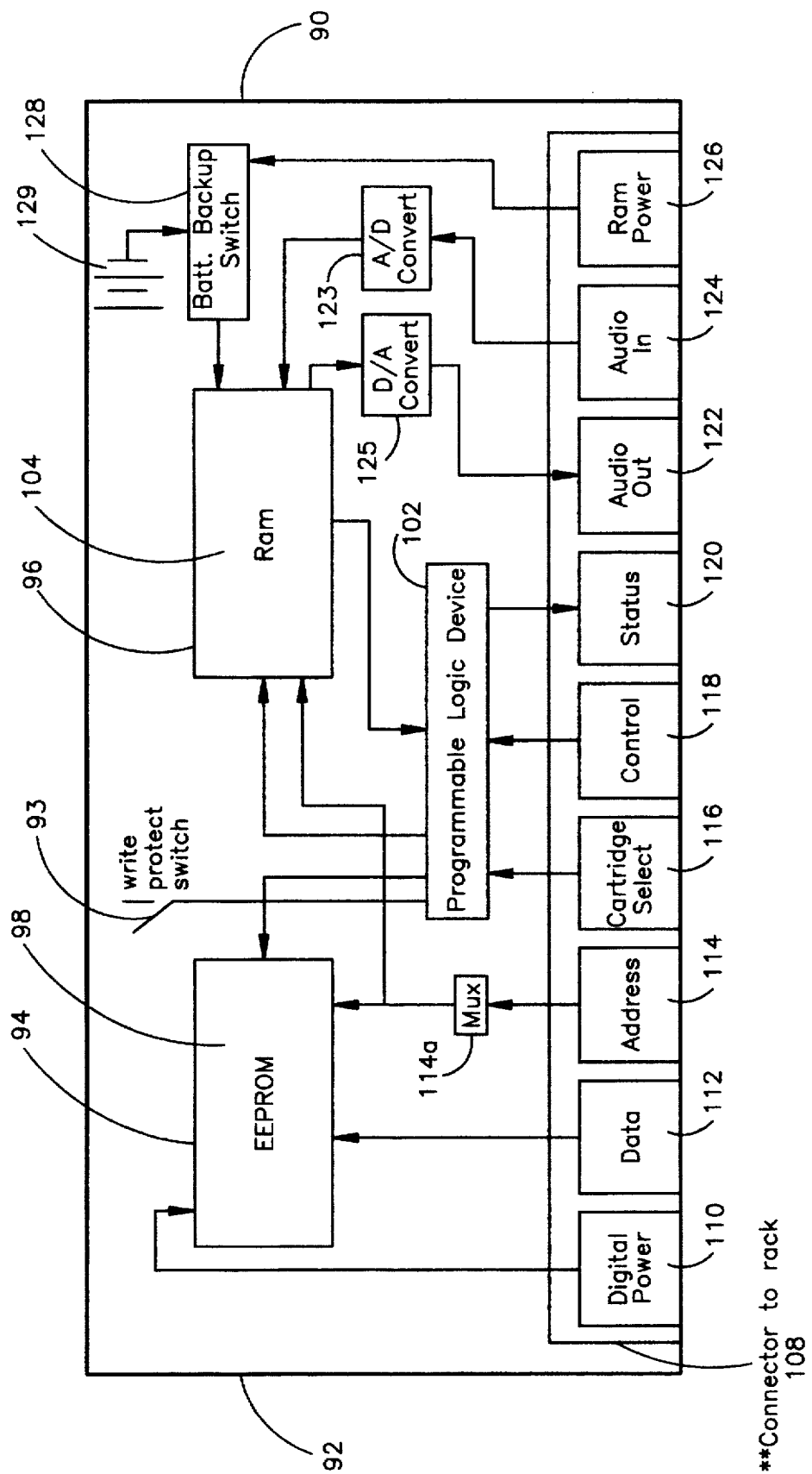
FIG. 11b is a detailed block diagram of a music cartridge which stores digital audio signals.

FIG. 11b shows a schematic illustration of a preferred musical cartridge 90 which stores digital audio signals. The audio storage means 104 is preferably an array of MCM81600 Motorola DRAM memory modules. Because both EEPROM 98 and audio storage means 104 store digital information, a MUX 114a is used as a controller to distinguish and/or direct signals from address contact 114 to a selected one of the EEPROM 98 and DRAM 104. Audio signals from audio-in contact 124 pass through an A/D converter 123 and are then stored in audio storage means 104. Audio signals from the audio storage means 104 pass through D/A converter 125 to the audio-out contact 122. The A/D converter is preferably an AD1851/AD1861 from Analog Devices, Norword, Mass., and the D/A converter is preferably a C54303 from Crystal Semiconductor Corp. The cartridge of FIG. 11b is also provided with a battery back-up switch 128 and battery 129 to provide voltage to prevent the DRAM memory from losing information when power is removed from the circuit. The battery back-up switch 128 will automatically detect when the cartridge is removed from the cartridge rack 60 or when the cartridge rack looses power. Power is supplied to the cartridge from battery 129 only when no power is supplied from the cartridge rack 60.

Besides retrieving information and playing songs stored on a cartridge 90, the user will also be able to modify the information stored in the EEPROM 98, and record audio signals to the audio storage medium 104. A locking mechanism, either a mechanical switch or slide, or a bit in the EEPROM 98, or both, will be provided to prevent accidental modification, but the user may unlock the cartridge 90 to allow recording.

Figure 12:
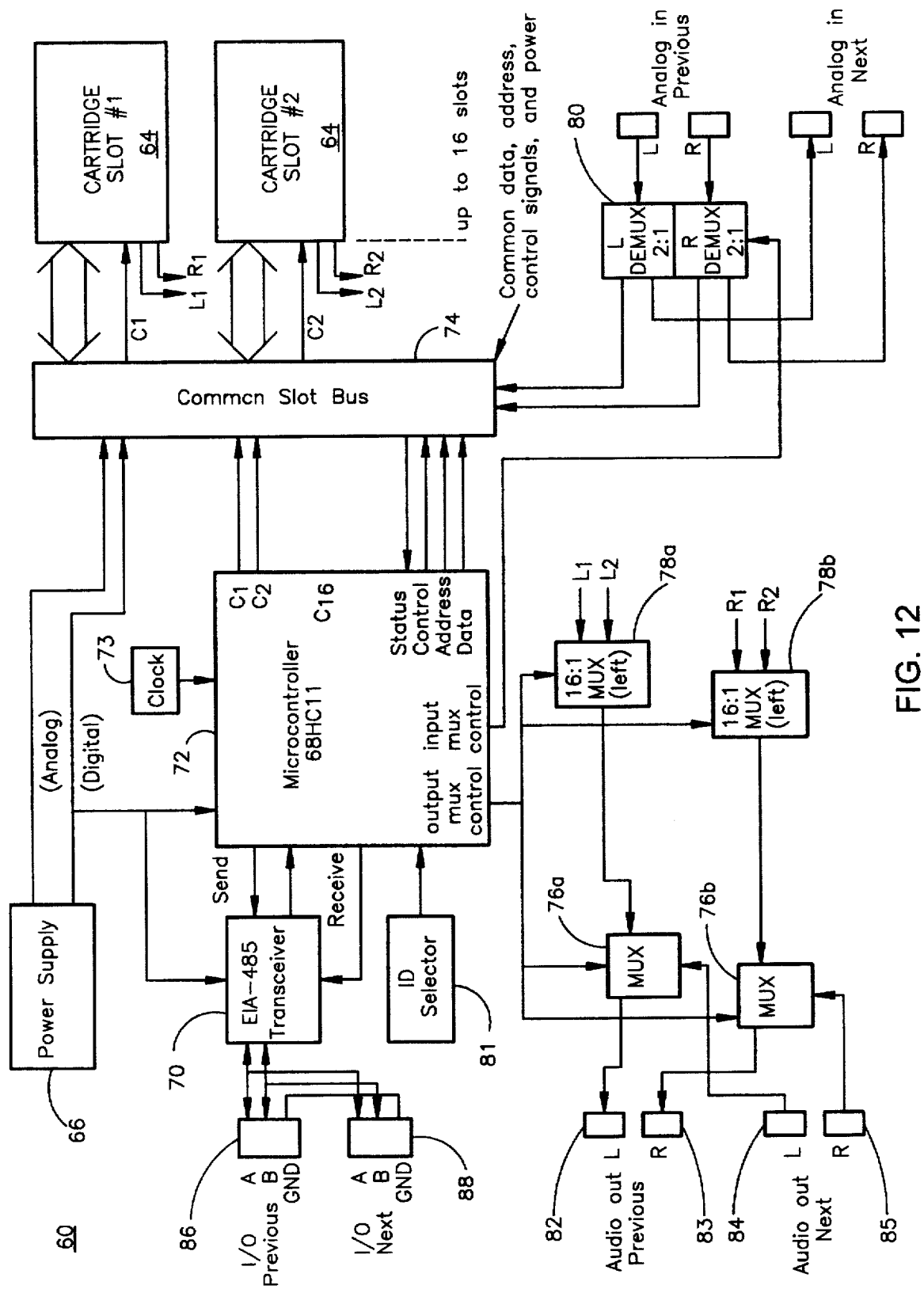
FIG. 12 is a schematic block diagram of the cartridge holder/storage rack of the present invention.

FIG. 12 illustrates a schematic diagram of the cartridge holder/storage rack 60 of the present invention. As can be seen, cartridge holder/storage rack 60 includes a power supply 66, an ID selector switch 81, and EIA-485 transceiver 70, a micro controller 72, a clock 73, a common slot bus 74, a plurality of analog multiplexes 76a, 76b and 78a, 78b, demultiplexes 80, audio-out previous jacks 82, audio-out next jacks 84, I/O previous jacks 86, I/O next jacks 88, and cartridge slots 64.

Player 20 and cartridge racks 60 communicate across a serial communications network using the electrical specifications of the EIA-485 transceiver 70. Player 20 and racks 60 communicate according to a master slate protocol in which the player 20 initiates all messages and the desired rack response as required according to the command given by the player. The EIA-485 interface is an interface that permits multiple talkers and multiple listeners to communicate. This allows the player to communicate with multiple cartridge racks. The player 20 may either request status information, retrieve data from any cartridge or play a particular song by directing the electrical signals of a particular song to be output to the tuner/amplifier.

Each rack 60 contains an ID selector switch 81 which the user sets to uniquely identify each cartridge rack 60 connected on the network. A power supply 66 provides separate power to the circuits 94 and 96 respectively. The EIA-485 transceiver connects the microcontroller 72 to the communication network.

Multiplexes (MUX) 76a, 76b and Demultiplexes (DEMUX) 80 control the audio signals being passed from one storage rack to another. If none of the cartridges within the storage rack are selected, the MUX and DEMUX will pass the signals from the audio-in jacks to the audio-out jacks. The MUX 78a and 78b control the signals within the storage rack. They direct the signals to the desired cartridge within the storage rack.

The microcontroller 72, such as a Motorola 68HC11, interprets the commands on the network and responds to commands addressed to this rack 60 as required by the communications protocol. Certain commands will cause it to access a specific cartridge 90 connected to the cartridge slot bus 74. When a song on a specific cartridge 90 is to be played, the microcontroller 72 connects the audio output signals from that cartridge 90 to the audio-out jacks on the cartridge racks 60 by activating the appropriate control signals to the analog multiplexers 76a, 76b, 78a, and 78b. If no cartridge 90 on the rack 60 is playing a song, the microcontroller 72 sets the multiplexers 76a and 76b to pass the audio signals from the audio-in jacks to the audio-out jacks.

Figure 13:
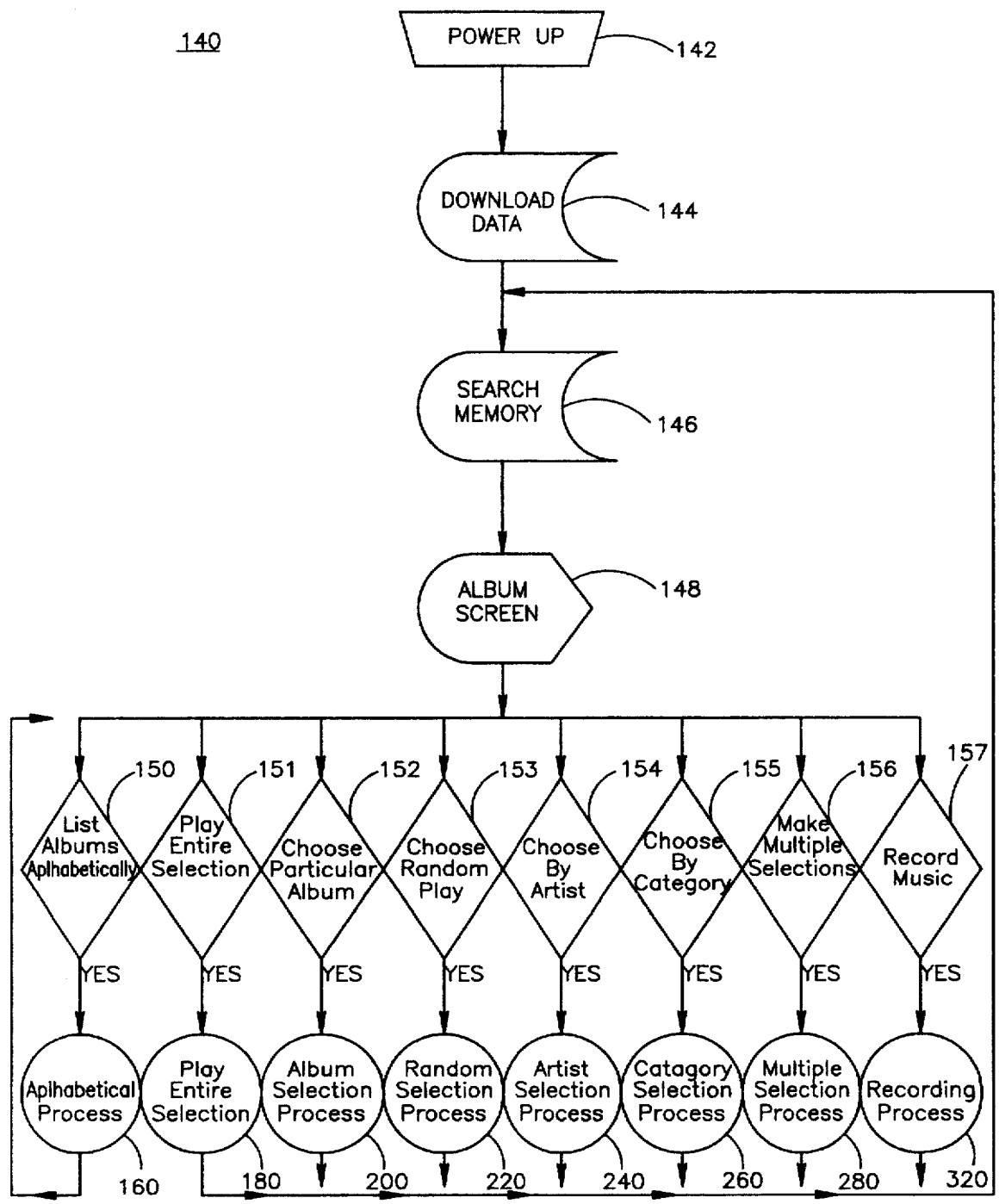
FIG. 13 is a flow chart of the initialization process of the present invention.

The audio system of the present system 10 utilizes software to control the system. The software runs through an initialization process 140 illustrated in FIG. 13. FIG. 13 illustrates the initialization process 140 in a flow chart beginning with power up 142 upon which data is downloaded 144 from EEPROMs 98, memory of the system is searched 146, and the album screen is displayed 148 on the visual display 26 of player 20. At this point, the user has several options. The user may list albums of the collection alphabetically 150. The user may choose to play the entire selection 151, a particular album 152, or choose random play 153. The user can play music from selection by artist 154, or by musical category 155. The user can make multiple selections to play 156, or can record music 157.

At each bootup the system will proceed through the initialization process 140 as outlined. The player 20 will first download the digital data stored on EEPROM 98 from all cartridges 90 connected to each storage rack 60. It will then search that information for all album titles and then display them chronologically as inserted into each storage rack for the user to use. The user will then have the ability to select from one of eight options.

If the user chooses to list albums alphabetically, option 150, he can then proceed to the alphabetical process 160. Should the user select to play the entire selection, option 151, the user proceeds to the play entire selection process 180. If the user selects to choose a particular album, option 152, the user then proceeds to the album selection process 200. Should the user choose random play, option 153, the user then proceeds to the random selection process 220. Should the user choose to play music by artist, option 154, the user proceeds to the selection process 240. If the user chooses to play music by category, option 155, the user then proceeds to the category process 260. If the user selects to make multiple selections, option 156, the software proceeds to the multiple selection process 280. Should the user select to record music, option 157, the software will run recording process 320. These processes will be described with reference to FIGS. 14–21.

Figure 14:
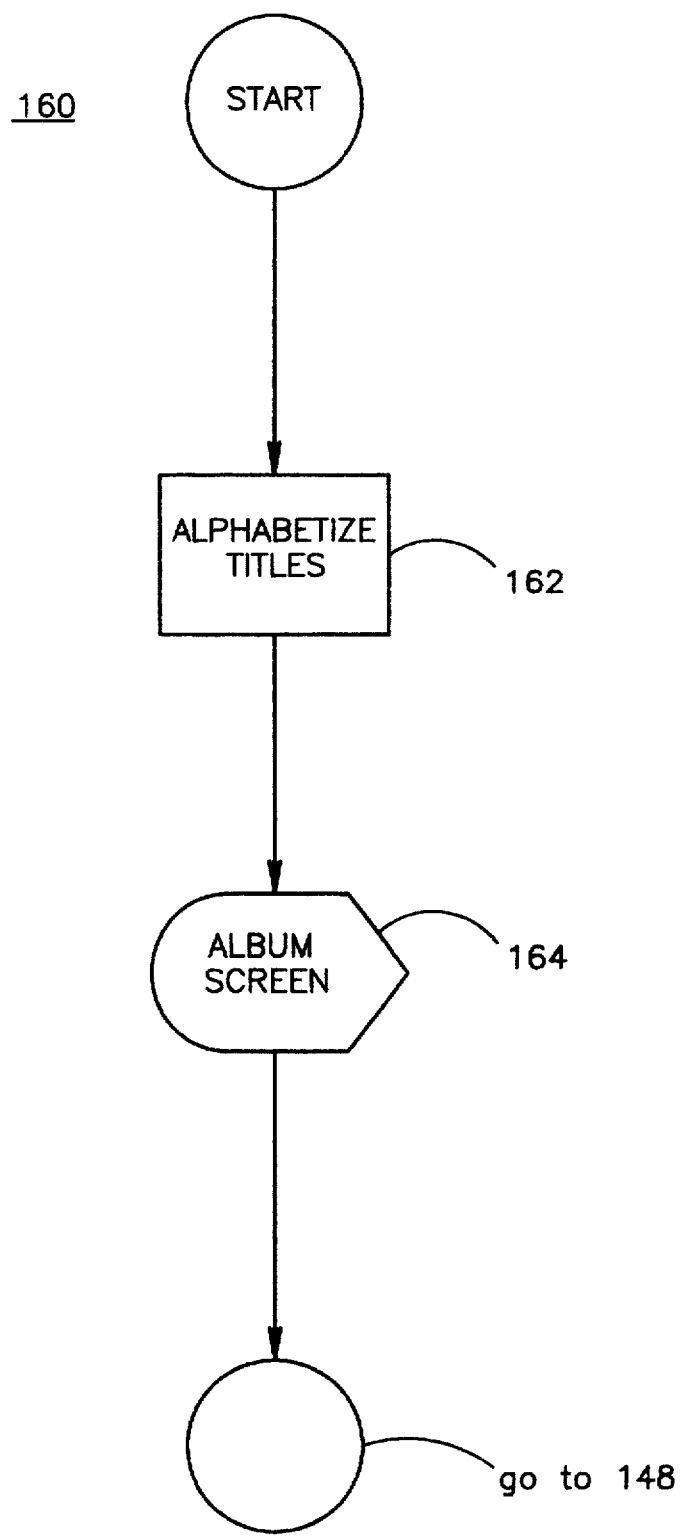
FIG. 14 is a flow chart of the alphabetizing process of the present invention.

FIG. 14 shows the flow diagram of the alphabetical process 160, wherein the software alphabetizes the album titles at step 162 and sends this information to the album screen visual display, step 164. The software 130 then returns the user to step 148 of the initialization process.

The alphabetical process 160 will arrange the album titles alphabetically, display them for the user, and then return back to all other options available in the initialization process 140. The alphabetical process is advantageous because as the user adds cartridges to the collection, there is no need to arrange or rearrange the cartridges in any particular order.

Figure 15:
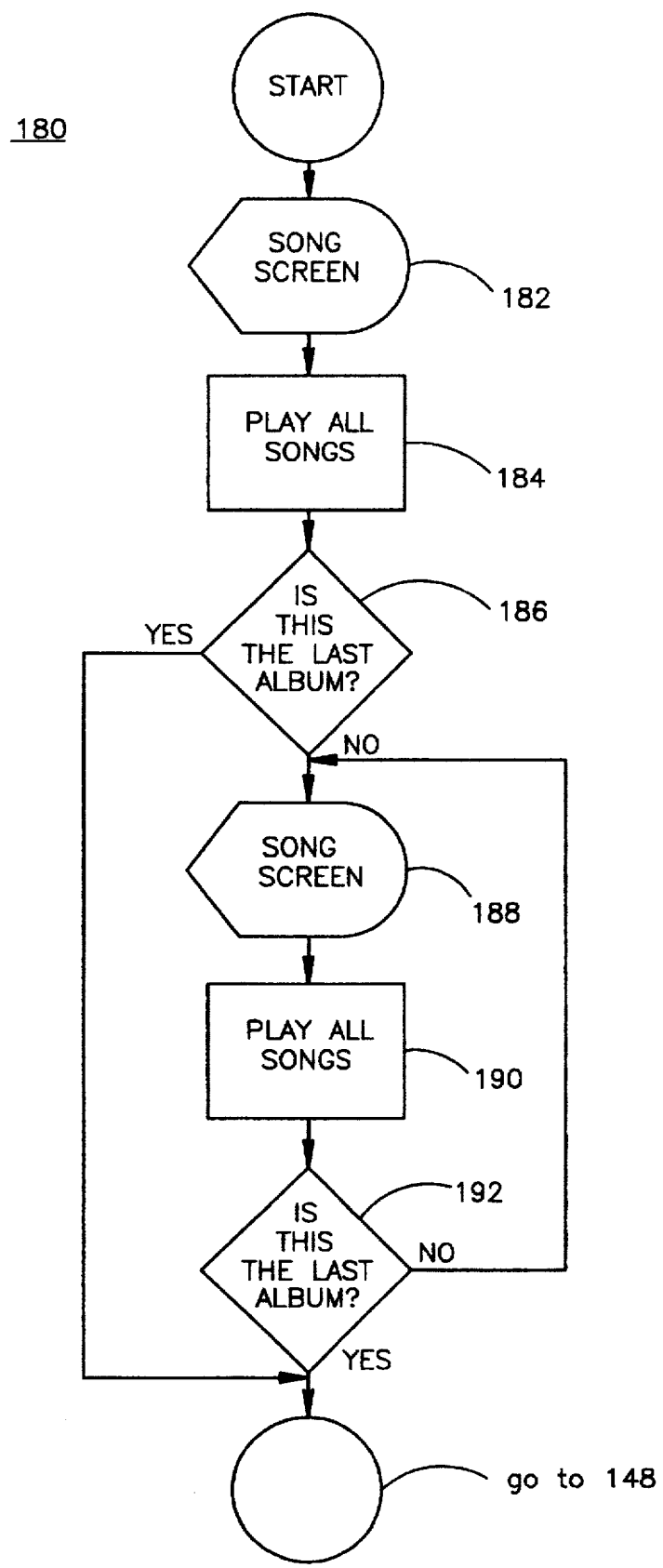
FIG. 15 is a flow chart of the entire collection process of the present invention.

FIG. 15 shows a flow chart of the play entire collection process 180 comprising the steps of displaying the song screen of the first listed album at step 182, and playing all the songs from the song screen at step 184. The software then determines whether the last listed album had been played at step 186. If the last listed album has been played, the software returns to step 148 of the initialization process and awaits further command. If the last listed album has not been played, the software proceeds to the song screen for the next listed album at step 188 and plays all the songs for this next album at step 190. The software then makes another determination of whether the last album has been played at step 192. If the last album has been played the software proceeds to return to step 148 of the initialization process. If the last album has not been played, the software will jump back to step 188 and proceed to play all of the songs from all of the remaining albums.

The process to play the entire collection 180 will begin by displaying all songs of the first album listed and then play those songs beginning with the first, then second, then third, and so on until the last song in that album is played. The player 20 will then proceed with the next album, display all songs and play them until the last album in the user's collection is played. The player 20 will then return to the album screen of the initialization process 140.

Figure 16:
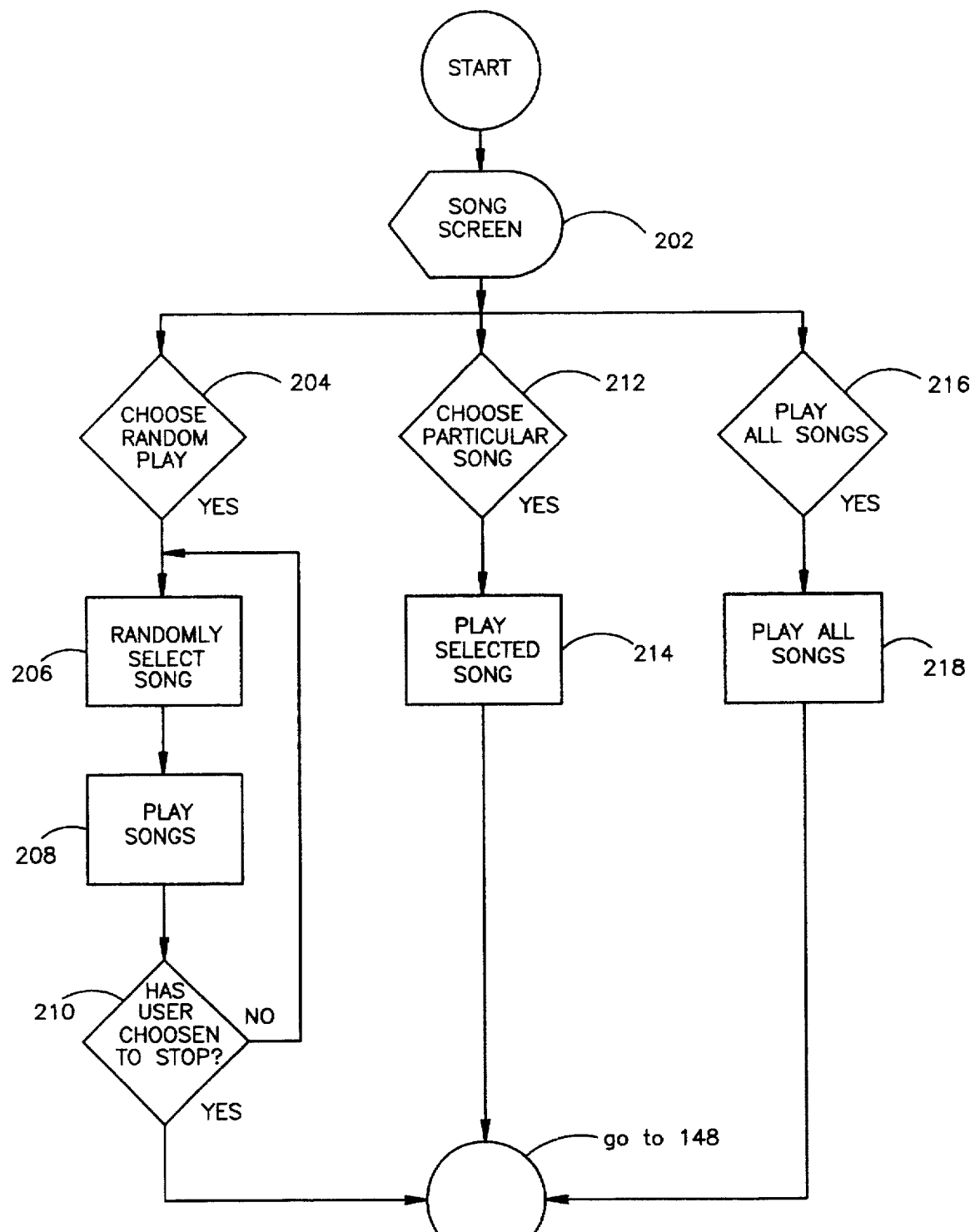
FIG. 16 is a flow chart of the single album selection process of the present invention.

FIG. 16 illustrates in flow chart form, the album selection process 200. From the album screen 148, the user selects a desired album to be played by using the directional pad 28m to scroll to the desired album title displayed on the screen 26. The software then displays the song screen of the selected album at step 202, at which time the user has the option of randomly playing the songs of the album at step 204, choosing a particular song from the song screen at step 212 or playing all the songs on the song screen at step 216.

Should the user decide to randomly play the songs on the song screen, step 204, the software will randomly select a song from the song screen at step 206, and play that song at step 208. After playing the song, the software will determine if the user has chosen to stop randomly playing songs at step 210. If the user had decided to stop playing songs, the software will move back to step 148 of initialization process and await further command. If no stop command has been entered by the user, the software will return to step 206 and randomly select and play another song from the selected album.

Should the user choose to play a particular song, step 212, the software will play the selected song at step 214, and then return to step 148 of initialization process and await further command.

Should the user select to play all songs, step 216, the software will signal the computer to play all of the songs on the song screen, in listed order, at step 218, and then return to step 148 of initialization process.

Figure 17:
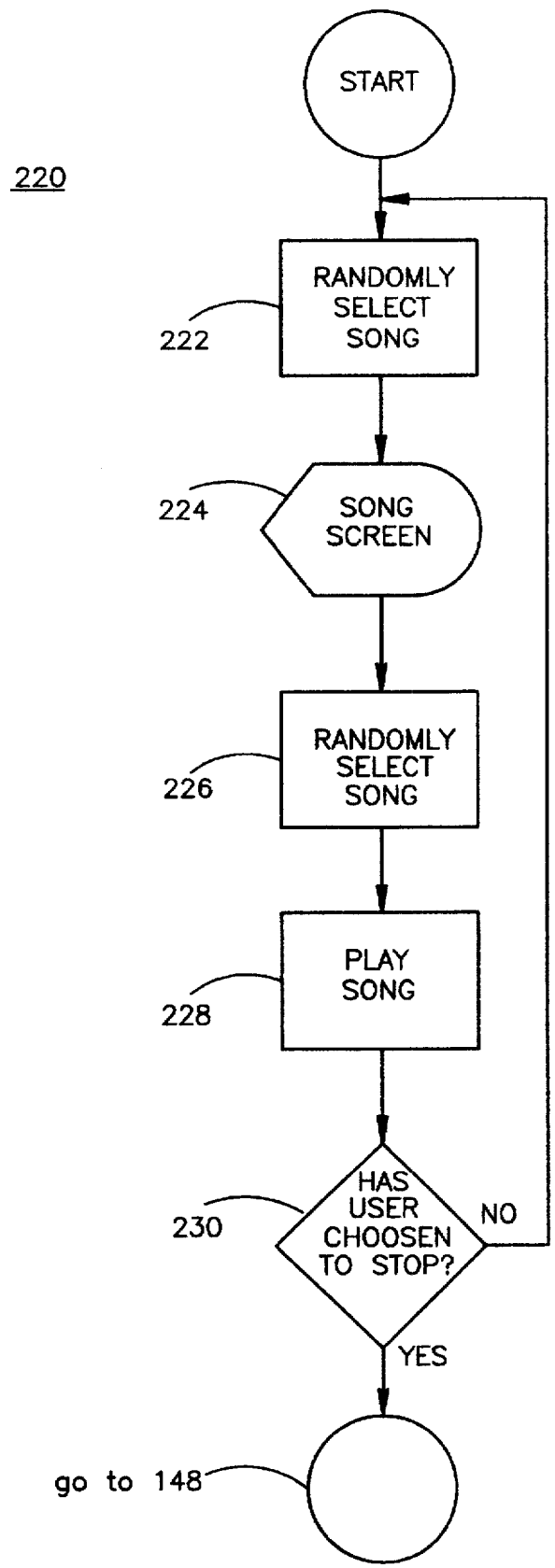
FIG. 17 is a flow chart of the random selection process of the present invention.

FIG. 17 illustrates in flow chart form the random selection process 220, wherein an album is randomly selected from the album screen 148 by the software, at step 222. The songs of that album are then displayed on the song screen at step 224. The software will randomly select one of the songs appearing on the song screen, at step 226, and play that song, step 228. The software, after playing the song, will determine whether the user has chosen to stop, at step 230. If the user has chosen to stop play, the software will return to step 148 of initialization process and await further command. If no stop command has been entered, the software will return to the randomly selected album step 222 and continue the process.

The random selection process 220 will begin by the player 20 generating a random number and then using that number to choose an album. It will then display the songs of that selection, generate another random number and use that number to choose one of the songs displayed. It will play that song, and then reiterate this process until the stop button of the player is activated. It will then return to the album screen 148 of the initialization process.

Figure 18:
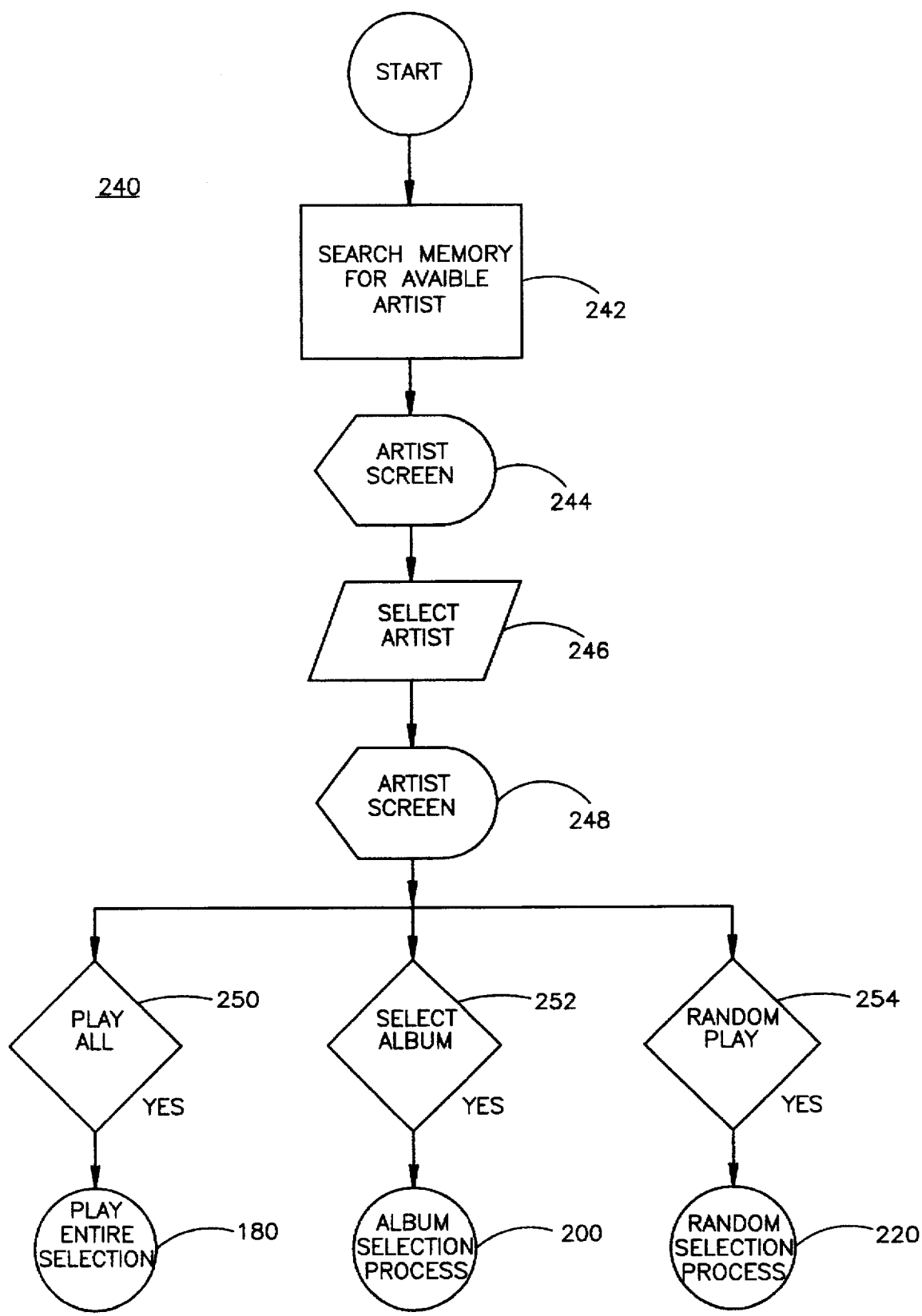
FIG. 18 is a flow chart of the artist selection process of the present invention.

FIG. 18 illustrates the artist selection process 240. The software will search the RAM memory for every available artist, downloaded from each musical cartridge's digital memory at boot up, at step 242. All of the artists available in the users collection will be displayed in an artist screen on the display 26, at step 244. The user will select an artist using the interface 28, at step 246, and the software will display all of that artist's albums available in the user's collection in an album screen, at step 248. The user then has the option to play all songs of that selected artist, step 250, to play a single album of that artist, step 252, or to randomly play songs from that artist, step 254. If the user chooses to play all the albums of that artist, step 250, the software will proceed to the play entire selection process 180. Should the user choose to play a single album of the artist, step 252, the software will proceed to album selection process 200. Should user desire to randomly play songs from the selected artist, step 254, the software will move to the random selection process 220, utilizing the album screen from step 248.

Figure 19:
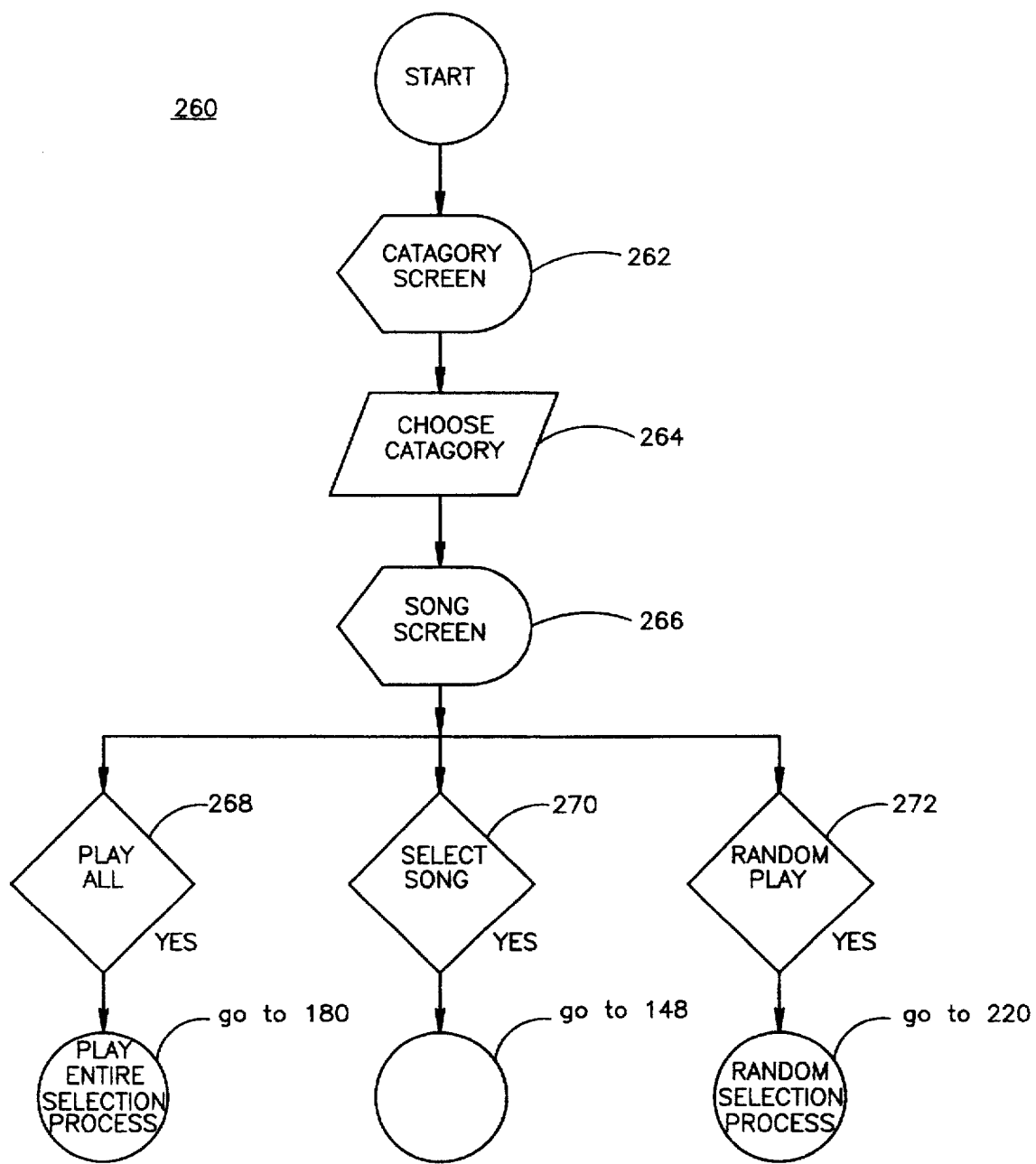
FIG. 19 a flow chart of the category selection process of the present invention.

FIG. 19 illustrates in flow chart form the category selection process 260, wherein songs are designed by category, such as rock, jazz, soul, classical, rap, religion, instrumental, heavy metal, movie sound track, Christmas, gold, easy listening, pop, country western, top 40, etc. The software displays a category screen at step 262, which displays, in display 26, the category choices. The user then chooses a category using the interface 28, at step 264. The songs from that category appear on a song screen, step 266, wherein, the user has the option of playing all the songs, step 268, selecting a single song, step 270, or randomly playing songs from the song screen, step 272. Should a user choose to play all the songs, step 268, the software proceeds to the play entire selection process 180. Should the user select to play a specific song, step 270, that song is played and the software then returns to step 148 of initialization process. Should the user select to randomly play the songs, step 272, the software proceeds to the random selection process 220.

The user will be able to program as many songs as desired, limited only by the amount of memory available dictated by the player's design or the addresses of chosen selections.

Figure 20:
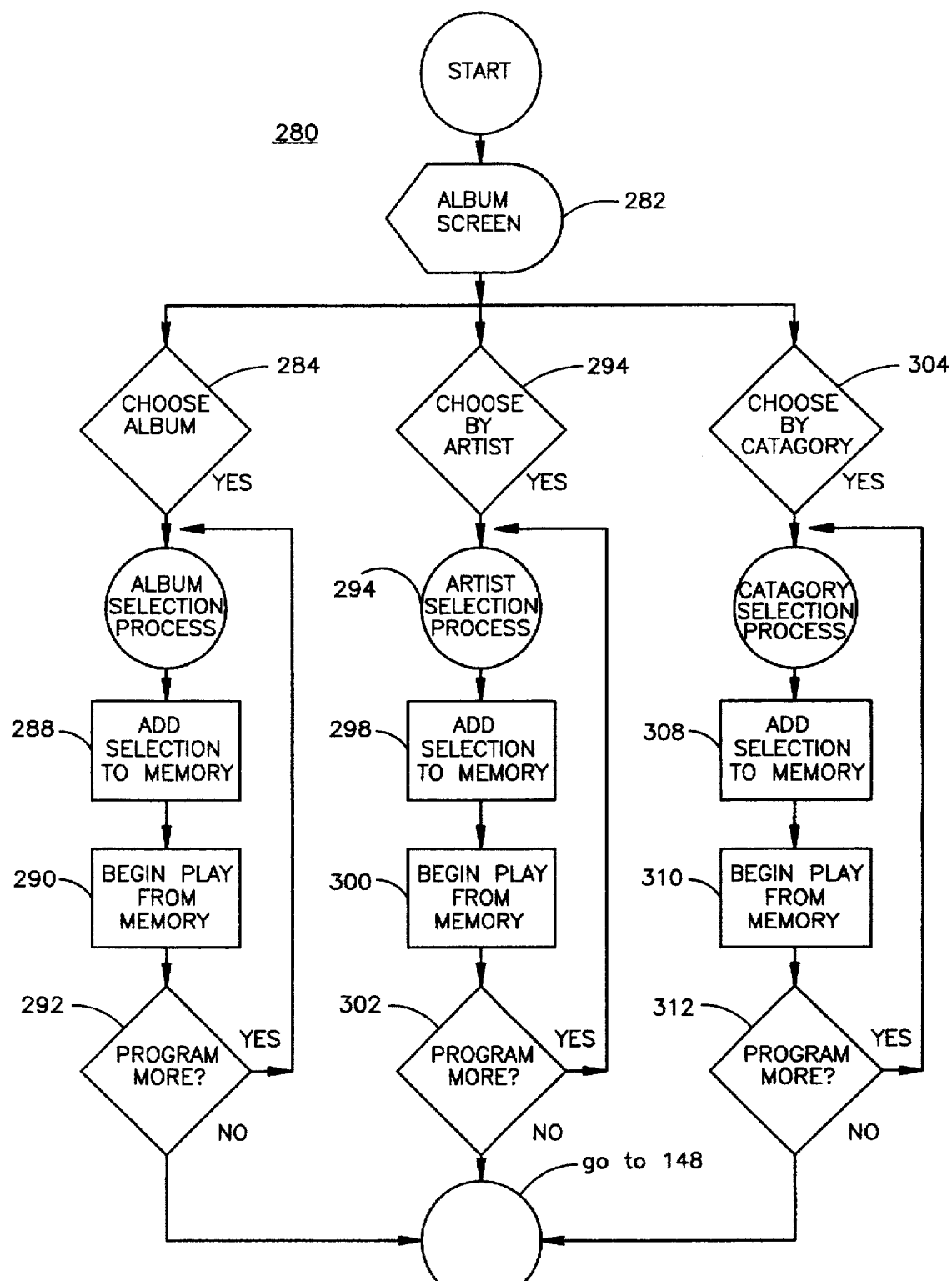
FIG. 20 is a flow chart of the multiple selection process of the present invention.

FIG. 20 illustrates in flow chart form the multiple selection process 280. The albums of the music collection are shown on an album screen, step 282. The user then has the option of choosing a single album, step 284, choosing albums by artist, step 294, or choosing albums by category, step 304.

If the user selects choose album, step 284, the software proceeds through the album selection process 200. Once the album selection process 200 has been completed, the software adds the starting address of that selection to a temporary memory at step 288. The software then begins to play songs from this album in the memory, at step 290, whereupon the software awaits a command to program another album or not, step 292. If the user does not want to program another album, the software returns to step 148 of initialization process. If the user decides to program another album, the software returns to the album selection process 200.

Should the user choose to select multiple artists, step 294, the software proceeds to the artist selection process 240. Once the user selects an artist from the artist selection process 240, the software adds the starting address of that artist selection to the temporary memory, at step 298, and begins to play songs from that artist, step 300. The software then determines whether the user desires to program additional artists, step 302. If no additional artists are to be programmed, the software returns to step 148 of initialization process. Should the user desire to program additional artists, the software returns to the artist selection process 240.

If user selects to choose music by category, step 304, the software proceeds to the category selection process 260. Once the category selection process is completed, the software adds the starting address of that selection to the temporary memory, at step 308, and begins to play songs from memory, step 310. The software then determines whether additional selections are forthcoming, at step 312. If no additional selections have been chosen, the software returns to step 148 of initialization process. Should user desire to choose additional selections by category, the program returns to the category selection process 260.

Figure 21:
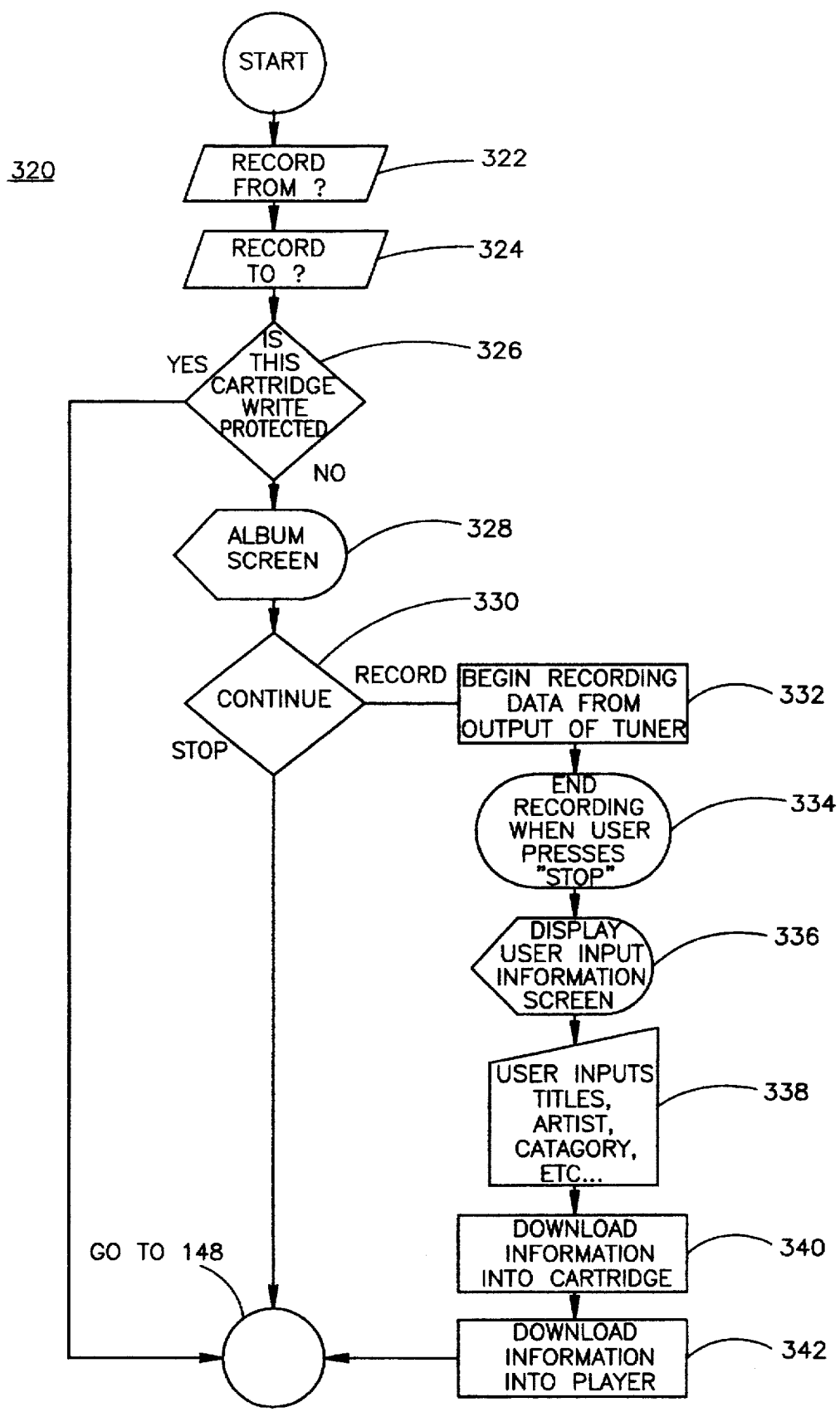
FIG. 21 is a flow chart of the record process of the present invention.

FIG. 21 illustrates the recording process 320 of the present invention, wherein, the software determines from where the user desires to record, at step 322. For example, the user can choose to record from a CD player, radio, television, etc. by selecting the appropriate button or tuner/amplifier 50. After selecting the desired medium to record from, the user then presses the Record button 281 on player 20. The software will then prompt the user to enter where the user wants to record to, for example rack 6 slot 7, at step 326. When the user enters a location, the software will determine whether the cartridge at that location is write protected by switch 93, at step 326. If the cartridge is write protected, or if there is no cartridge at this location, the software will return to step 148 of the initialization process. If the cartridge in the entered location is not write protected, the software will then display the album screen showing what music, if any, is on the cartridge, at step 328. The software then prompts the user to continue or not, at step 330. The user can abort the process by pressing stop and the software will return to step 148 of the initialization process. If the user desires to continue, the user must press the Record button to begin recording, at step 332. Once the Record button is depressed, the system will begin recording all data received from the output of the tuner. The music is then recorded at step 332 onto the audio storage medium 104 of a cartridge 90. The system will continue recording until interrupted by the user depressing the stop button, or until all available memory on the cartridge is filled, at step 334. Once the music is recorded, the user is prompted to input descriptive information, for example, artist, album title, song title, etc., for the newly-recorded music through pre-designed questions, at step 336. The user inputs the requested information at step 338 and the software then stores this information into the digital data medium 98 of the music cartridge 90, at step 340. Finally, the software downloads this newly-added information to the CPU of player 20 at step 342 and then returns to step 148 of the initialization process and awaits further instructions.

Player 20 of the audio system is preferably a computer with a display 26, an interface 28, an EIA-485 communication port 70. Either a user's personal computer such as a Packard Bell 386 as 486 with a symmetric technology NBS-2 communications card or an imbedded controller designed specifically for use with a stereo system could be used. The player 20 will download a database of information from the EEPROM 98 of each cartridge 90 located in the cartridge racks 60 into local RAM memory when the system is first activated or when a cartridge 90 is added to a rack 60. The user will be able to query the large database of information that has been downloaded from the EEPROM of each cartridge and accumulated in the RAM memory of the CPU, in a number of ways, including selecting songs based on specific criteria, displaying information about any song, or listening to a particular song or sequence of songs. The user will also be able to "jump tracks", i.e., to play any song on any cartridge no matter where it is on that cartridge, i.e., beginning, middle, or end of cartridge. The user will also be able to build a "play list" of unlimited time with various delay times in between each song. Plus this list can be modified at any time in a matter of seconds without disturbing the playing of a selected song. Additionally, the user will be able to do "key word", artist, album name, song title, year released, or type of music searches for any song which is plugged into any storage rack connected to the system. Further, the user will see a visual display of all information, i.e., inventory of songs, albums, artists, and play lists selected.

Preferably, the EIA-485 interface of the present invention is manufactured by Cimetrics Technology, Ithaca, N.Y., part no. NBS-2.

For the parts for the musical cartridge, the EEPROM 98 is preferably manufactured from Xicor, Inc., Milpitas, Calif., part no. X2816C. Audio storage medium 104 could be, for example a DAST Chip array, manufactured by Information Storage Devices, Inc., San Jose, Calif., part no. ISD2560 or an array of MCM81600 DRAM memory modules manufactured by Motorola, Inc. The programmable logic device 102 is preferably manufactured by Altera Corp., San Jose, Calif., part no. EP1810.

The parts of the cartridge rack are preferably as follows. The EIA-485 transceiver 70 is preferably manufactured by Texas Instruments, Inc., Dallas, Tex., part no. SN75176D. The 16:1 analog multiplexer 78a, 78b is preferably manufactured by Motorola, Inc., Schaumburg, Ill., part no. MC14067B. The 2:1 analog multiplexer/demultiplexer 80 is preferably manufactured by Motorola, Inc., Schaumburg, Ill., part no. MC14551B. The microcontroller 72 is preferably manufactured by Motorola, Inc., Schaumburg, Ill., part no. 68HC11. The power supply 66 is preferably manufactured by Astec Standard Power, Oceanside, Calif., part no. ECV5N3-1. The ID selector 81 (BCD switches) is preferably manufactured by Augat Alcoswitch, North Andover, Md., part no. PIC0131.

The present invention has advantages and uses that can impact a wide range of individuals and industries. The solid state storage and reproduction music system allows for automatic inventory processing of the detailed information about each song on each music cartridge in the system to the player. The expandable system is capable of fully integrating computers with home/commercial audio systems. A user will no longer be limited to one, five or even a hundred CDs or other music storage mediums to listen to at a time. The system allows selective playback of music in several manners which have not been possible before, such as playback of all music from a collection, which music was released in a certain year. Users will be able to unify their entire music library into one complete system. All of their selections can be accessed at once, in seconds, in a variety of ways. Radio stations will be able to completely computerize their music selection system. Private D.J.s will be able to contain their entire library in a locked cabinet on wheels, thus giving them mobility and security from losing albums, and allowing them to search and play any and all selections in a variety of ways.

It is foreseen that the principles of the present invention may have uses that go beyond audio systems. For example, the present invention could be slightly modified to be used in connection with home entertainment video game systems such as SEGA GENESIS™ and SUPER NES™ systems which utilize video game cartridges. The cartridge rack 60 of the present invention could be utilized to receive these game cartridges, wherein a user could simply turn on the system and play any game from any cartridge in the cartridge rack. This would eliminate the need to repeatedly swap game cartridges and would further provide a very efficient means for neatly storing all of the different game cartridges.

It is to be understood that the embodiments herein described are merely illustrative of the principles of the present invention. Various modifications may be made by those skilled in the art without departing from the spirit or scope of the claims which follow.

What is claimed is:

1. A system for the selective storage and reproduction of a plurality of digital signals from multiple remote locations, comprising:

an apparatus for storing and retrieving digital signals stored in multiple remote locations;

at least one remote digital audio signal storage medium rack operative connected to said apparatus, said system being expandable by operatively connecting a plurality of remote digital audio storage medium racks in series;

at least one self-contained digital audio signal storage medium removably connected with said at least one remote rack for storing digital audio signals;

said apparatus including a computer means for the selective reproduction from and storage of digital audio signals to said at least one digital audio signal storage medium, and a communications port operatively connected to said computer means and said at least one remote rack;

said at least one self-contained digital audio signal storage medium including a housing, an audio signal storage means in said housing, an information database storage means in said housing a programmable logic device in electrical communication with said audio signal storage means, said information database storage means, and said apparatus for storing and retrieving signals, and a connector tongue;

said at least one remote digital audio signal storage medium rack including a storage rack, a plurality of slots in said rack for receiving said at least one self-contained digital audio signal storage medium, and a connector tongue receiver in each of said plurality of slots for receiving said connector tongue of said at least one self-contained digital audio signal storage medium;

said apparatus accessing said information database storage means upon initiation of said system to provide for automated inventory control.

2. The system of claim 1, further comprising associated software for controlling said system.

3. An audio system for the selective storage and reproduction of digital signals from a plurality of remote locations, said system comprising:

an apparatus for storing and retrieving digital signals stored in a plurality of remote locations, said apparatus comprising a housing, a central processing unit, a means for interfacing with said plurality of remote locations, a means for user input, and a means for displaying information;

at least one digital signal storage medium receiver operatively connected to said apparatus for storing and retrieving signals, said storage medium receiver having a plurality of locations, each capable of receiving a self-contained digital signal storage medium, said audio system being expandable by operatively connecting a plurality of digital signal storage medium receivers in series, said at least one digital signal storage medium receiver including a microcontroller, a bus, a transceiver and a plurality of signal controllers; and at least one self-contained digital signal storage medium selectively and removably inserted into one of said plurality of locations in said at least one digital signal storage medium receiver, said at least one self-contained digital signal storage medium including a first digital storage circuit and a second digital storage circuit, said first digital storage circuit storing digital audio signals and said second digital storage circuit storing a database of information;

wherein said database of information is accessed upon initiation of said audio system to provide for automated inventory control.

4. The audio system of claim 3, further comprising software for directing said central processing unit of said apparatus to selectively store and reproduce digital audio signals from said at least one digital signal storage medium inserted in said at least one digital signal storage medium receiver according to commands input through said means for user input.

5. The audio system of claim 3, wherein said first digital storage circuit includes an array of D-RAM memory modules and said second digital storage circuit includes an EEPROM.

6. The audio system of claim 3, wherein said at least one self-contained digital signal storage medium further includes a programmable logic device being in electrical communication with said first digital storage circuit and said second digital storage circuit, said programmable logic device selectively controlling the storage and reproduction of signals to and from said first digital storage circuit and said second digital storage circuit upon commands received by control contacts in said at least one self-contained digital signal storage medium.

7. The audio system of claim 6, wherein said at least one self-contained digital signal storage medium further comprising a means for selectively preventing the storage of signals.

8. The audio system of claim 6, wherein said first digital storage circuit comprises a storage array of D-RAM memory modules.

* * * * *